(12) United States Patent
Yamazaki et al.

(10) Patent No.: US 9,741,865 B2
(45) Date of Patent: Aug. 22, 2017

(54) METHOD OF FORMING SEMICONDUCTOR DEVICE INCLUDING OXIDE SEMICONDUCTOR STACK WITH DIFFERENT RATIO OF INDIUM AND GALLIUM

(71) Applicant: Semiconductor Energy Laboratory Co., Ltd., Atsugi-shi, Kanagawa-ken (JP)

(72) Inventors: Shunpei Yamazaki, Setagaya (JP); Junichi Koezuka, Tochigi (JP); Yukinori Shima, Tatebayashi (JP); Hajime Tokunaga, Yokohama (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 15/290,442

(22) Filed: Oct. 11, 2016

(65) Prior Publication Data

US 2017/0033229 A1  Feb. 2, 2017

Related U.S. Application Data

(63) Continuation of application No. 13/900,894, filed on May 23, 2013, now Pat. No. 9,496,408.

(30) Foreign Application Priority Data

May 31, 2012 (JP) ................................ 2012-125432

(51) Int. Cl.
*H01L 29/786* (2006.01)
*H01L 21/02* (2006.01)
(Continued)

(52) U.S. Cl.
CPC ...... *H01L 29/7869* (2013.01); *H01L 21/0217* (2013.01); *H01L 21/02164* (2013.01);
(Continued)

(58) Field of Classification Search
CPC .................... H01L 29/7869; H01L 21/02164
See application file for complete search history.

(56) References Cited

U.S. PATENT DOCUMENTS 5,731,856 A  3/1998 Kim et al.
5,744,864 A  4/1998 Cillessen et al.
(Continued)

FOREIGN PATENT DOCUMENTS

CN  101814529 A  8/2010
CN  102640292 A  8/2012
(Continued)

OTHER PUBLICATIONS

International Search Report (Application No. PCT/JP2013/064555) Dated Aug. 6, 2013.
(Continued)

*Primary Examiner* — Thanh V Pham
(74) *Attorney, Agent, or Firm* — Eric J. Robinson; Robinson Intellectual Property Law Office, P.C.

(57) ABSTRACT

A highly reliable semiconductor device including an oxide semiconductor is provided by preventing a change in its electrical characteristics. A semiconductor device which includes a first oxide semiconductor layer which is in contact with a source electrode layer and a drain electrode layer and a second oxide semiconductor layer which serves as a main current path (channel) of a transistor is provided. The first oxide semiconductor layer serves as a buffer layer for preventing a constituent element of the source and drain electrode layers from diffusing into the channel. By providing the first oxide semiconductor layer, it is possible to
(Continued)

prevent diffusion of the constituent element into an interface between the first oxide semiconductor layer and the second oxide semiconductor layer and into the second oxide semiconductor layer.

20 Claims, 13 Drawing Sheets

(51) Int. Cl.
    H01L 29/24     (2006.01)
    H01L 29/423     (2006.01)
    H01L 29/49     (2006.01)
    H01L 29/51     (2006.01)
    H01L 29/66     (2006.01)

(52) U.S. Cl.
    CPC ........ *H01L 21/02274* (2013.01); *H01L 29/24* (2013.01); *H01L 29/42356* (2013.01); *H01L 29/4908* (2013.01); *H01L 29/513* (2013.01); *H01L 29/518* (2013.01); *H01L 29/66969* (2013.01); *H01L 29/78696* (2013.01)

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,601,984 B2 | 10/2009 | Sano et al. |
| 7,674,650 B2 | 3/2010 | Akimoto et al. |
| 7,732,819 B2 | 6/2010 | Akimoto et al. |
| 7,910,490 B2 | 3/2011 | Akimoto et al. |
| 7,923,722 B2 | 4/2011 | Ryu et al. |
| 7,932,521 B2 | 4/2011 | Akimoto et al. |
| 7,994,500 B2 | 8/2011 | Kim et al. |
| 8,058,645 B2 | 11/2011 | Jeong et al. |
| 8,148,779 B2 | 4/2012 | Jeong et al. |
| 8,188,480 B2 | 5/2012 | Itai |
| 8,202,365 B2 | 6/2012 | Umeda et al. |
| 8,203,143 B2 | 6/2012 | Imai |
| 8,247,276 B2 | 8/2012 | Kondo et al. |
| 8,274,077 B2 | 9/2012 | Akimoto et al. |
| 8,274,078 B2 | 9/2012 | Itagaki et al. |
| 8,362,563 B2 | 1/2013 | Kondo et al. |
| 8,389,989 B2 | 3/2013 | Yamazaki et al. |
| 8,471,256 B2 | 6/2013 | Yamazaki et al. |
| 8,629,000 B2 | 1/2014 | Kondo et al. |
| 8,692,252 B2 | 4/2014 | Takata et al. |
| 8,710,499 B2 | 4/2014 | Yamazaki et al. |
| 8,987,822 B2 | 3/2015 | Kondo et al. |
| 9,105,735 B2 | 8/2015 | Yamazaki et al. |
| 9,209,283 B2 | 12/2015 | Kondo et al. |
| 9,368,641 B2 | 6/2016 | Yamazaki et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0072439 A1 | 3/2007 | Akimoto et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308797 A1 | 12/2008 | Akimoto et al. |
| 2008/0308804 A1 | 12/2008 | Akimoto et al. |
| 2008/0308806 A1 | 12/2008 | Akimoto et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0239335 A1 | 9/2009 | Akimoto et al. |
| 2009/0278122 A1 | 11/2009 | Hosono et al. |
| 2009/0280600 A1 | 11/2009 | Hosono et al. |
| 2009/0321731 A1 | 12/2009 | Jeong et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0176383 A1 | 7/2010 | Park et al. |
| 2010/0181565 A1 | 7/2010 | Sakata et al. |
| 2010/0301329 A1 | 12/2010 | Asano et al. |
| 2010/0320458 A1 | 12/2010 | Umeda et al. |

(56) References Cited

U.S. PATENT DOCUMENTS

| | | |
|---|---|---|
| 2010/0320459 A1 | 12/2010 | Umeda et al. |
| 2011/0073856 A1 | 3/2011 | Sato et al. |
| 2011/0090204 A1 | 4/2011 | Yamazaki et al. |
| 2011/0127524 A1 | 6/2011 | Yamazaki et al. |
| 2011/0140100 A1 | 6/2011 | Takata et al. |
| 2011/0193083 A1 | 8/2011 | Kim et al. |
| 2011/0215328 A1 | 9/2011 | Morosawa et al. |
| 2011/0240990 A1 | 10/2011 | Yamazaki |
| 2011/0240991 A1 | 10/2011 | Yamazaki |
| 2011/0240992 A1 | 10/2011 | Yamazaki |
| 2011/0240993 A1 | 10/2011 | Yamazaki |
| 2011/0240994 A1 | 10/2011 | Yamazaki |
| 2011/0240995 A1 | 10/2011 | Yamazaki |
| 2011/0248260 A1 | 10/2011 | Yamazaki |
| 2011/0284845 A1 | 11/2011 | Endo et al. |
| 2011/0284846 A1 | 11/2011 | Endo et al. |
| 2012/0061662 A1 | 3/2012 | Yamazaki et al. |
| 2012/0119205 A1 | 5/2012 | Taniguchi et al. |
| 2012/0149147 A1 | 6/2012 | Yamazaki et al. |
| 2012/0153278 A1 | 6/2012 | Jeong et al. |
| 2013/0320330 A1 | 12/2013 | Yamazaki |
| 2013/0334523 A1 | 12/2013 | Yamazaki |
| 2013/0334533 A1 | 12/2013 | Yamazaki |
| 2016/0079435 A1 | 3/2016 | Kondo et al. |

FOREIGN PATENT DOCUMENTS

| | | |
|---|---|---|
| EP | 1737044 A | 12/2006 |
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-270617 A | 9/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 A | 4/2007 |
| JP | 2007-123861 A | 5/2007 |
| JP | 2009-231613 A | 10/2009 |
| JP | 2010-016347 A | 1/2010 |
| JP | 4415062 | 2/2010 |
| JP | 2010-067954 A | 3/2010 |
| JP | 2010-073881 A | 4/2010 |
| JP | 2010-161327 A | 7/2010 |
| JP | 2010-177431 A | 8/2010 |
| JP | 4571221 | 10/2010 |
| JP | 2011-124360 A | 6/2011 |
| JP | 2011-135061 A | 7/2011 |
| JP | 2011-143745 A | 7/2011 |
| JP | 2011-243745 A | 12/2011 |
| JP | 2012-059860 A | 3/2012 |
| JP | 2012-084858 A | 4/2012 |
| JP | 2012-160679 A | 8/2012 |
| KR | 2012-0028272 A | 3/2012 |
| KR | 2012-0102723 A | 9/2012 |
| WO | WO-2004/114391 | 12/2004 |
| WO | WO-2008/133345 | 11/2008 |
| WO | WO-2011/027656 | 3/2011 |
| WO | WO-2011/065208 | 6/2011 |

OTHER PUBLICATIONS

Written Opinion (Application No. PCT/JP2013/064555) Dated Aug. 6, 2013.

Ono.M at al., "Novel High Performance IGZO-TFT with High Mobility over 40 cm2/Vs and High Photostability Incorporated Oxygen Diffusion", IDW '11 : Proceedings of the 18th International Display Workshops, Dec. 7, 2011, pp. 1689-1690.

Nakayama et al., "17a-TL-8 Effect of GaO Layer on IGZO-TFT Channel", Extended Abstracts (The 57th Spring Meeting 2010), The Japan Society of Applied Physics and Related Societies, Mar. 17, 2010, pp. 21-008.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Takahashi.M et al., "Theoretical Analysis of IGZO Transparent Amorphous Oxide Semiconductor", IDE '08 : Proceedings of the 15th International Display Workshops, Dec. 3, 2008, pp. 1637-1640.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kimizuka.N. et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Asakuma.N. et al., "Crystallization and Reduction of Sol-Gel-Derived Zinc Oxide Films by Irradiation with Ultraviolet Lamp", Journal of Sol-Gel Science and Technology, 2003, vol. 26, pp. 181-184.

Osada.T et al., "15.2: Development of Driver-Integrated Panel using Amorphous In—Ga—Zn—Oxide TFT", SID Digest '09 : SID International Symposium Digest of Technical Papers, May 31, 2009, vol. 40, pp. 184-187.

Nomura.K et al., "Carrier transport in transparent oxide semiconductor with intrinsic structural randomness probed using singe-crystalline InGaO3(ZnO)5 films", Appl. Phys. Lett. (Applied Physics Letter) , Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT", SID International Symposium Digest of Technical Papers, May 20, 2008, vol. 39, pp. 633-636.

(56) References Cited

OTHER PUBLICATIONS

Lee.J et al., "World'S Largest (15-Inch) XGA AMLCD Panel Using IGZO Oxide TFT", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge Generation Layer", Adv. Mater. (Advanced Materials), 2006, vol. 18, No. 3, pp. 339-342.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure", IEDM 09: Technical Digest of International Electron Devices Metting, Dec. 7, 2009, pp. 191-194.

Kurokawa.Y et al., "UHF RFCPUS on Flexible and Glass Substrates for Secure RFID Systems", Journal of Solid-State Circuits , 2008, vol. 43, No. 1, pp. 292-299.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and its Bending Porperties", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.S et al., "Challenge to Future Displays: Transparent AM-OLED Driven by Peald Grown ZnO TFT", IMID '07 Digest, 2007, pp. 1249-1252.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Ohara.H et al., "21.3:4.0 In. QVGA AMOLED Display Using In—Ga—Zn—Oxide TFTs With a Novel Passivation Layer", SID Digest '09 : SID International Symposium Digest of Technical Papers, May 31, 2009, pp. 284-287.

Miyasaka,M, "SUFTLA Flexible Microelectronics on Their Way to Business", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transisitors", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Lee.H et al., "Current Status of, Challenges to, and Perspective View of AM-OLED ", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phase for Display Application", SID Digest '07 : SID International Symposium Digest of Technical Papers, 2007, vol. 38, pp. 1737-1740.

Nakamura.M, "Synthesis of Homologous Compound with New Long-Period Structure", NIRIM Newsletter, Mar. 1, 1995, vol. 150, pp. 1-4.

Kikuchi.H et al., "Polymer-Stabilized Liquid Crystal Blue Phases", Nature Materials, Sep. 2, 2002, vol. 1, pp. 64-68.

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Kitzerow.H et al., "Observation of Blue Phases in Chiral Networks", Liquid Crystals, 1993, vol. 14, No. 3, pp. 911-916.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

(56) References Cited

OTHER PUBLICATIONS

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Janotti.A et al., "Oxygen Vacancies in ZnO", Appl. Phys. Lett. (Applied Physics Letters), 2005, vol. 87, pp. 122102-1-122102-3.

Oba.F et al., "Defect energetics in ZnO: A hybrid Hartree-Fock density functional study", Phys. Rev. B. (Physical Review. B), 2008, vol. 77, pp. 245202-1-245202-6.

Orita.M et al., "Amorphous transparent conductive oxide InGaO3(ZnO)m (m<4):a Zn4s conductor", Philosophical Magazine, 2001, vol. 81, No. 5, pp. 501-515.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays", IDW '08 ; Proceedings of the 6th International Display Workshops, Dec. 3, 2008, pp. 581-584.

Kim.S et al., "High-Performance oxide thin film transistors passivated by various gas plasmas", 214th ECS Meeting, 2008, No. 2317, ECS.

Clark.S et al., "First Principles Methods Using CASTEP", Zeitschrift fur Kristallographie, 2005, vol. 220, pp. 567-570.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Nathan.A et al., "Amorphous Oxide TFTs: Progress and Issues", SID Digest '12 : SID International Symposium Digest of Technical Papers, Jun. 5, 2012, vol. 43, No. 1, pp. 1-4.

Chinese Office Action (Application No. 201380028160.0) Dated Aug. 23, 2016.

Chinese Office Action (Application No. 201380028160.0) dated Mar. 13, 2017.

METHOD OF FORMING SEMICONDUCTOR DEVICE INCLUDING OXIDE SEMICONDUCTOR STACK WITH DIFFERENT RATIO OF INDIUM AND GALLIUM

TECHNICAL FIELD

The invention disclosed in this specification and the like relates to a semiconductor device and a method for manufacturing the semiconductor device.

In this specification and the like, a semiconductor device refers to all types of devices which can function by utilizing semiconductor characteristics; an electro-optical device, an image display device, a semiconductor circuit, and an electronic appliance are all semiconductor devices.

BACKGROUND ART

A technique by which transistors are formed using semiconductor thin films formed over a substrate having an insulating surface has been attracting attention. Such a transistor is applied to a wide range of electronic devices such as an integrated circuit (IC) and an image display device (also simply referred to as a display device). A silicon-based semiconductor material is widely known as a material for a semiconductor thin film applicable to a transistor. As another material, an oxide semiconductor has been attracting attention.

For example, a technique by which a transistor is formed using zinc oxide or an In—Ga—Zn-based oxide semiconductor as an oxide semiconductor is disclosed (see Patent Documents 1 and 2).

Non-Patent Document discloses a transistor having a structure in which oxide semiconductors having different compositions are stacked.

REFERENCE

Patent Document

[Patent Document 1] Japanese Published Patent Application No. 2007-123861
[Patent Document 2] Japanese Published Patent Application No. 2007-096055

Non-Patent Document

[Non-Patent Document 1] Masashi Ono et al., "Novel High Performance IGZO-TFT with High Mobility over 40 cm$^2$/Vs and High Photostability Incorporated Oxygen Diffusion", IDW'11 Late-News Paper, pp. 1689-1690.

DISCLOSURE OF INVENTION

In a transistor including an oxide semiconductor, if a trap level (also referred to as an interface state) exists at an interface between an oxide semiconductor layer and a layer in contact with the oxide semiconductor layer, the existence of the trap level causes a change in the electrical characteristics (e.g., the threshold voltage or the subthreshold swing (s value)) of the transistor.

For example, in a bottom-gate transistor, when a constituent element of a source electrode layer and a drain electrode layer diffuses into a back channel of an oxide semiconductor layer, the constituent element forms a trap level, so that the electrical characteristics of the transistor is changed. Further, the existence of a trap level at an interface between the oxide semiconductor layer and a gate insulating layer might cause a change in the electrical characteristics of the transistor.

Thus, an object of one embodiment of the present invention is to provide a highly reliable semiconductor device including an oxide semiconductor by preventing a change in its electrical characteristics.

One embodiment of the present invention is a bottom gate transistor including an oxide semiconductor, which has at least a stacked structure formed of a first oxide semiconductor layer which is in contact with a source electrode layer and a drain electrode layer and a second oxide semiconductor layer which is provided between the first oxide semiconductor layer and a gate insulating layer. In the above transistor, the second oxide semiconductor layer is used as a main current path (channel) of the transistor and the first oxide semiconductor layer is used as a buffer layer for preventing diffusion of a constituent element of the source and drain electrode layers, whereby a change in the electrical characteristics of the transistor can be prevented. Specifically, any of the following structures can be employed for example.

One embodiment of the present invention is a semiconductor device including a gate electrode layer, a gate insulating layer over the gate electrode layer, an oxide semiconductor stack overlapping with the gate electrode layer with the gate insulating layer positioned therebetween, and a source electrode layer and a drain electrode layer electrically connected to the oxide semiconductor stack. The oxide semiconductor stack includes a first oxide semiconductor layer in contact with the source electrode layer and the drain electrode layer and a second oxide semiconductor layer provided between the first oxide semiconductor layer and the gate insulating layer. The first oxide semiconductor layer contains at least indium and gallium, and the content of the indium is lower than or equal to the content of the gallium in the first oxide semiconductor layer. The second oxide semiconductor layer contains at least indium and gallium, and the content of the indium is higher than the content of the gallium in the second oxide semiconductor layer. The first oxide semiconductor layer contains a constituent element of the source electrode layer and the drain electrode layer, as an impurity.

Another embodiment of the present invention is a semiconductor device including a gate electrode layer, a gate insulating layer over the gate electrode layer, an oxide semiconductor stack overlapping with the gate electrode layer with the gate insulating layer positioned therebetween, and a source electrode layer and a drain electrode layer electrically connected to the oxide semiconductor stack. The oxide semiconductor stack includes a first oxide semiconductor layer in contact with the source electrode layer and the drain electrode layer, a third oxide semiconductor layer in contact with the gate insulating layer, and a second oxide semiconductor layer provided between the first oxide semiconductor layer and the third oxide semiconductor layer. The first oxide semiconductor layer and the third oxide semiconductor layer contain at least indium and gallium, and the content of the indium is lower than or equal to the content of the gallium in the first oxide semiconductor layer and the third oxide semiconductor layer. The second oxide semiconductor layer contains at least indium and gallium, and the content of the indium is higher than the content of the gallium in the second oxide semiconductor layer. The first oxide semiconductor layer contains a constituent element of the source electrode and the drain electrode layer, as an impurity.

Another embodiment of the present invention is a semiconductor device including a gate electrode layer, a gate insulating layer over the gate electrode layer, an oxide semiconductor stack overlapping with the gate electrode layer with the gate insulating layer positioned therebetween, and a source electrode layer and a drain electrode layer electrically connected to the oxide semiconductor stack. The oxide semiconductor stack includes a first oxide semiconductor layer in contact with the source electrode layer and the drain electrode layer, a third oxide semiconductor layer in contact with the gate insulating layer, and a second oxide semiconductor layer provided between the first oxide semiconductor layer and the third oxide semiconductor layer. The first oxide semiconductor layer and the third oxide semiconductor layer contain at least indium and gallium, the content of the indium is lower than or equal to the content of the gallium in the first oxide semiconductor layer and the third oxide semiconductor layer. The second oxide semiconductor layer contains at least indium and gallium, and the content of the indium is higher than the content of the gallium in the second oxide semiconductor layer. The first oxide semiconductor layer contains a constituent element of the source electrode and the drain electrode layer, as an impurity. The third oxide semiconductor layer contains a constituent element of the gate insulating layer, as an impurity.

In any one of the above semiconductor devices, the source electrode layer and the drain electrode layer preferably contain copper.

In any one of the above semiconductor devices, the gate insulating layer may include a silicon nitride film.

Effects of a structure according to one embodiment of the present invention can be described as follow. Note also that the following description is just a consideration.

The transistor of one embodiment of the present invention includes the first oxide semiconductor layer which is in contact with the source electrode layer and the drain electrode layer and the second oxide semiconductor layer which serves as a main current path (channel) of the transistor. Here, the first oxide semiconductor layer serves as a buffer layer for preventing a constituent element of the source and drain electrode layers from diffusing into the channel. By providing the first oxide semiconductor layer, it is possible to prevent diffusion of the constituent element into an interface between the first oxide semiconductor layer and the second oxide semiconductor layer and into the second oxide semiconductor layer.

Further, it is preferable that a metal oxide which is applied to the first oxide semiconductor layer have a larger energy gap (band gap) than a metal oxide which is applied to the second oxide semiconductor layer because a conduction band offset can be formed between the second oxide semiconductor layer and the first oxide semiconductor layer. When the conduction band offset exists in the oxide semiconductor stack, carriers flow through the second oxide semiconductor layer without passing through the first oxide semiconductor layer and the interface thereof; thus even if a trap level due to the diffusion of the metal element exists on the back channel side, the oxide semiconductor stack is insusceptible to the trap level. Accordingly, the electrical characteristics of the transistor can be stabilized.

It is preferable that the transistor of one embodiment of the present invention further include a third oxide semiconductor layer which is provided between the second oxide semiconductor layer and the gate insulating layer and is in contact with the gate insulating layer, in addition to the first oxide semiconductor layer and the second oxide semiconductor layer. The third oxide semiconductor layer contains one or a plurality of metal elements selected from the constituent elements of the second oxide semiconductor layer, and the third oxide semiconductor layer includes characteristics of the second oxide semiconductor layer. Therefore, when the third oxide semiconductor layer is provided, the interface on the gate insulating layer side of the second oxide semiconductor layer functioning as the channel can be stabilized. That is, the third oxide semiconductor layer functions as a buffer layer for preventing degradation of the interface. In particular, photodegradation (e.g., negative-bias temperature stress photodegradation) of the transistor can be reduced by prevention of capture of carriers at the interface on the gate insulating layer side of the channel, so that the transistor can have high reliability.

Further, it is preferable that, in a manner similar to the metal oxide applied to the first oxide semiconductor layer, a metal oxide which is applied to the third oxide semiconductor layer have a larger energy gap than the metal oxide applied to the second oxide semiconductor layer because a conduction band offset can be formed between the third oxide semiconductor layer and the second oxide semiconductor layer. Also in a general MISFET, a trap level or the like is generated at an interface between a gate insulating layer and a semiconductor and the electrical characteristics of the FET is degraded; however, when a third oxide semiconductor layer is provided, the MISFET has a structure in which carriers flow through a region which is apart from the gate insulating layer (what is called a buried channel), and therefore influence of the interface can be reduced.

In the case where metal oxides which are formed of the same constituent elements but have different compositions are applied to the first oxide semiconductor, the second oxide semiconductor, and the third oxide semiconductor, for example, metal oxides containing at least indium and gallium can be used as the first oxide semiconductor, the second oxide semiconductor, and the third oxide semiconductor. Here, as the ratio of the indium content to the content of the other metal element(s) becomes higher in the metal oxide, the field-effect mobility of the metal oxide is increased; as the ratio of the gallium content to the content of the other metal element(s) becomes higher in the metal oxide, the energy gap of the metal oxide is increased. Therefore, a metal oxide in which the indium content is higher than the gallium content is preferably used as the second oxide semiconductor to be a channel formation region, and metal oxides in which the indium content is lower than or equal to the gallium content are preferably used as the first oxide semiconductor and the third oxide semiconductor which function as buffer layers.

According to one embodiment of the present invention, a change in the electrical characteristics of a transistor including an oxide semiconductor can be prevented, so that a highly reliable semiconductor device can be provided.

BEST MODE FOR CARRYING OUT THE INVENTION

Figure 1A:
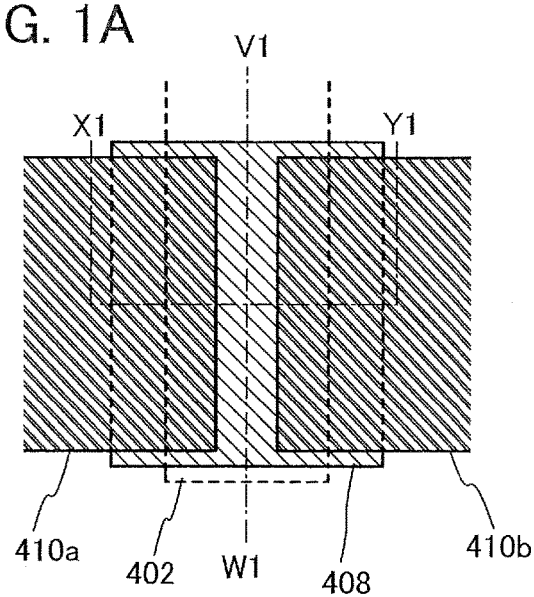
FIGS. 1A to 1C are a plan view and cross-sectional views illustrating one embodiment of a semiconductor device.

Hereinafter, embodiments and an example of the present invention will be described in detail with reference to the accompanying drawings. Note that the present invention is not limited to the description below and it is easily understood by those skilled in the art that the mode and details can be changed in various ways. Therefore, the invention should not be construed as being limited to the description in the following embodiments and example.

Note that in structures of the present invention described below, the same portions or portions having similar functions are denoted by the same reference numerals in different drawings, and description thereof is not repeated. Further, the same hatching pattern is applied to portions having similar functions, and the portions are not especially denoted by reference numerals in some cases.

Note that in each drawing described in this specification, the size, the film thickness, or the region of each component is exaggerated for clarity in some cases. Therefore, embodiments of the present invention are not limited to such scales.

Note that the ordinal numbers such as "first" and "second" in this specification and the like are used for convenience and do not denote the order of steps or the stacking order of layers. In addition, the ordinal numbers in this specification do not denote particular names which specify the present invention.

In this specification, a term "parallel" indicates that the angle formed between two straight lines is greater than or equal to −10° and less than or equal to 10°, and accordingly also includes the case where the angle is greater than or equal to −5° and less than or equal to 5°. In addition, a term "perpendicular" indicates that the angle formed between two straight lines is greater than or equal to 80° and less than or equal to 100°, and accordingly includes the case where the angle is greater than or equal to 85° and less than or equal to 95°.

In this specification, the trigonal and rhombohedral crystal systems are included in the hexagonal crystal system.

Embodiment 1

In this embodiment, one embodiment of a semiconductor device and one embodiment of a method for manufacturing the semiconductor device are described using FIGS. 1A to 1C, FIGS. 2A to 2D, and FIGS. 3A to 3D. In this embodiment, a bottom-gate transistor including an oxide semiconductor layer is described as an example of the semiconductor device.

Figure 1C:
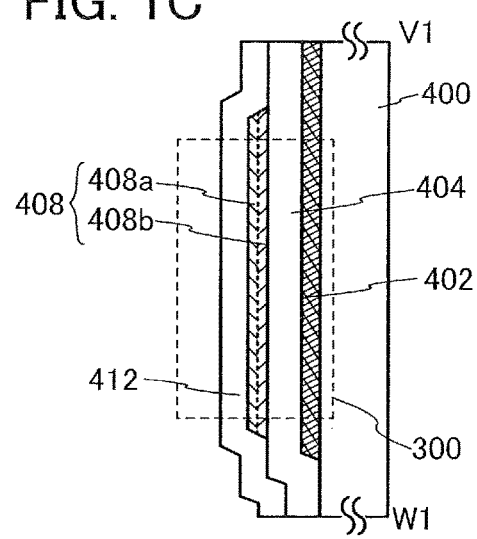
Figure 1B:
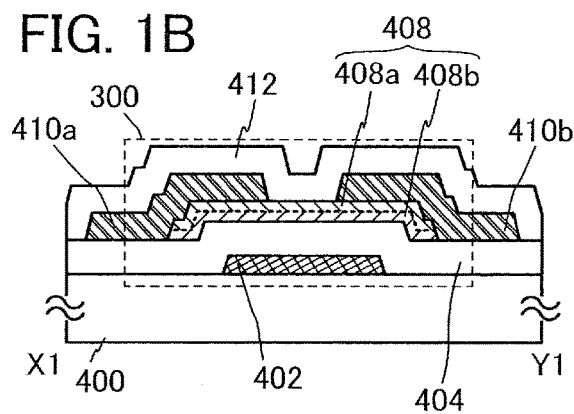

FIGS. 1A to 1C illustrate a structure example of a transistor 300. FIG. 1A is a plan view of the transistor 300, FIG. 1B is a cross-sectional view taken along dotted line X1-Y1 in FIG. 1A, and FIG. 1C is a cross-sectional view taken along dotted line V1-W1 in FIG. 1A.

The transistor 300 includes a gate electrode layer 402 which is provided over a substrate 400 having an insulating surface, a gate insulating layer 404 over the gate electrode layer 402, an oxide semiconductor stack 408 which is on and in contact with the gate insulating layer 404 and overlaps with the gate electrode layer 402, and a source electrode layer 410a and a drain electrode layer 410b which are electrically connected to the oxide semiconductor stack 408. Note that an insulating layer 412 which covers the source electrode layer 410a and the drain electrode layer 410b and is in contact with the oxide semiconductor stack 408 may be included in the transistor 300 as a component.

The oxide semiconductor stack 408 in the transistor 300 includes an oxide semiconductor layer 408a which is in contact with the source electrode layer 410a and the drain electrode layer 410b, and an oxide semiconductor layer 408b which is provided between the oxide semiconductor layer 408b and the gate insulating layer 404.

The oxide semiconductor layer 408b in the oxide semiconductor stack 408 is a region serving as a channel of the transistor 300. The oxide semiconductor layer 408a provided on the back channel side of the oxide semiconductor layer 408b functions as a buffer layer for preventing a constituent element of the source electrode layer 410a and the drain electrode layer 410b from diffusing into the oxide semiconductor layer 408b. That is, the oxide semiconductor layer 408a contains the constituent element of the source electrode layer 410a and the drain electrode layer 410b, as an impurity. By providing the buffer layer, formation of a trap level in the channel of the transistor 300 can be prevented; thus an increase in s-value due to the trap level can be prevented. Accordingly, variations in the electrical characteristics or degradation over time of the transistor can be prevented; thus a highly reliable semiconductor device can be provided.

For the oxide semiconductor layer 408a and the oxide semiconductor layer 408b, oxide semiconductors which have different constituent elements or oxide semiconductors which have the same constituent elements but whose compositions are different from each other may be used. Note that it is preferable that an oxide semiconductor which has high field-effect mobility be used for the oxide semiconductor layer 408b functioning as the channel of the transistor 300.

For example, in the case where the oxide semiconductor layer 408a and the oxide semiconductor layer 408b are formed to have the same constituent elements by using oxide semiconductors which contain at least indium and gallium, an oxide semiconductor in which the indium content is larger than the gallium content is preferably used for the oxide semiconductor layer 408b, and an oxide semiconductor in which the indium content is lower than or equal to the gallium content is preferably used for the oxide semiconductor layer 408a.

In an oxide semiconductor, the s orbital of heavy metal mainly contribute to carrier transfer, and when the percentage of indium in the oxide semiconductor is increased, overlaps of the s orbitals are likely to be increased. Accordingly, when the indium content is higher than the gallium content in the oxide semiconductor layer 408b, it is possible that the oxide semiconductor layer 408b has higher field-effect mobility than an oxide in which the indium content is lower than the gallium content.

Further, as the ratio of the gallium content to the content of the other metal element(s) becomes higher in a metal oxide, the energy gap of the metal oxide is increased. Accordingly, when the indium content is lower than or equal to the gallium content in the oxide semiconductor layer 408a, the oxide semiconductor layer 408a has a larger energy gap than the oxide semiconductor layer 408b. Accordingly, the above structure is preferable because a conduction band offset can be formed between the oxide semiconductor layer 408b and the oxide semiconductor layer 408a. Further, gallium needs large formation energy of an oxygen vacancy and thus is not likely to generate an oxygen vacancy as compared to indium. Therefore, a metal oxide in which the indium content is lower than or equal to the gallium content has stable characteristics as compared to a metal oxide in which the indium content is higher than the gallium content. Therefore, stabilization on the back channel side in the transistor 300 can be achieved.

For example, in the case where an In—Ga—Zn-based oxide semiconductor is used for the oxide semiconductor layer 408a and the oxide semiconductor layer 408b, an In—Ga—Zn-based oxide having any of atomic ratios of In:Ga:Zn=1:1:1 (=1/3:1/3:1/3), In:Ga:Zn=1:3:2 (=1/6:3/6:2/6), In:Ga:Zn=2:4:3 (=2/9:4/9:3/9), and In:Ga:Zn=1:5:3 (=1/9:5/9:3/9); or a metal oxide having an atomic ratio which is close to any of the above atomic ratios can be used for the oxide semiconductor layer 408a. As the oxide semiconductor layer 408b, an In—Ga—Zn-based oxide having any of atomic ratios of In:Ga:Zn=3:1:2 (=3/6:1/6:2/6), In:Ga:Zn=4:2:3 (=4/9:2/9:3/9), In:Ga:Zn=5:1:3 (=5/9:1/9:3/9), In:Ga:Zn=5:3:4 (=5/12:3/12:4/12), In:Ga:Zn=6:2:4 (=6/12:2/12:4/12), or In:Ga:Zn=7:1:3 (=7/11:1/11:3/11); or a metal oxide having an atomic ratio which is close to any of the above atomic ratios can be used.

Note that for example, the expression "the composition of an oxide including In, Ga, and Zn at the atomic ratio, In:Ga:Zn=a:b:c (a+b+c=1), is in the neighborhood of the composition of an oxide containing In, Ga, and Zn at the atomic ratio, In:Ga:Zn=A:B:C (A+B+C=1)" means that a, b, and c satisfy the following relation: $(a-A)^2+(b-B)^2+(c-C)^2 \leq r^2$. For example, r may be 0.05.

Note that the metal oxide which is applied to the oxide semiconductor stack 408 is not limited thereto, and a metal oxide which have an appropriate composition in accordance with required electrical characteristics (field-effect mobility, a threshold voltage, variations, and the like) may be used. In order to obtain the needed electrical characteristics, the carrier concentration, the impurity concentration, the defect density, the atomic ratio between a metal element and oxygen, the interatomic distance, the density, and the like are preferably set to appropriate values. For example, instead of gallium, another metal element may be contained. Alternatively, a metal oxide which does not contain zinc can be used. Note that it is preferable that a metal oxide which is to be applied contain zinc because a c-axis aligned crystalline oxide semiconductor (CAAC-OS) film can be relatively easily formed as the oxide semiconductor layer that is formed later.

Note that the oxide semiconductor layer can be formed by a sputtering method. Generation of particles in deposition can be prevented by using a sputtering target which contains indium. Therefore, it is preferable that the oxide semiconductor layer 408a and the oxide semiconductor layer 408b contain indium.

A structure of an oxide semiconductor layer is described below.

An oxide semiconductor layer is classified roughly into a single-crystal oxide semiconductor layer and a non-single-crystal oxide semiconductor layer. The non-single-crystal oxide semiconductor layer includes any of an amorphous oxide semiconductor layer, a microcrystalline oxide semiconductor layer, a polycrystalline oxide semiconductor layer, a c-axis aligned crystalline oxide semiconductor (CAAC-OS) film, and the like.

The amorphous oxide semiconductor layer has disordered atomic arrangement and no crystalline component. A typical example thereof is an oxide semiconductor layer in which no crystal part exists even in a microscopic region, and the whole of the film is amorphous.

The microcrystalline oxide semiconductor layer includes a microcrystal (also referred to as nanocrystal) with a size greater than or equal to 1 nm and less than 10 nm, for example. Thus, the microcrystalline oxide semiconductor layer has a higher degree of atomic order than the amorphous oxide semiconductor layer. Hence, the density of defect states of the microcrystalline oxide semiconductor layer is lower than that of the amorphous oxide semiconductor layer.

The CAAC-OS film is one of oxide semiconductor layers including a plurality of crystal parts, and most of the crystal parts each fit inside a cube whose one side is less than 100 nm. Thus, there is a case where a crystal part included in the CAAC-OS film fits inside a cube whose one side is less than 10 nm, less than 5 nm, or less than 3 nm. The density of defect states of the CAAC-OS film is lower than that of the microcrystalline oxide semiconductor layer. The CAAC-OS film is described in detail below.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS film.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle (2θ) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when 2θ is around 56°. This peak is derived from the (110) plane of the InGaZnO$_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor layer of InGaZnO$_4$, six peaks appear. The six peaks are derived from crystal planes equivalent to the (110) plane. On the other hand, in the case of a CAAC-OS film, a peak is not clearly observed even when φ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, in the case where a shape of the CAAC-OS film is changed by etching or the like, the c-axis might not be necessarily parallel to a normal vector of a formation surface or a normal vector of a top surface of the CAAC-OS film.

Further, the degree of crystallinity in the CAAC-OS film is not necessarily uniform. For example, in the case where crystal growth leading to the CAAC-OS film occurs from the vicinity of the top surface of the film, the degree of the crystallinity in the vicinity of the top surface is higher than that in the vicinity of the formation surface in some cases. Further, when an impurity is added to the CAAC-OS film, the crystallinity in a region to which the impurity is added is changed, and the degree of crystallinity in the CAAC-OS film varies depending on regions.

Note that when the CAAC-OS film with an InGaZnO$_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ do not appear at around 36°.

In a transistor using the CAAC-OS film, change in electric characteristics due to irradiation with visible light or ultraviolet light is small. Thus, the transistor has high reliability.

Note that an oxide semiconductor layer may be a stacked film including two or more of an amorphous oxide semiconductor layer, a microcrystalline oxide semiconductor layer, and a CAAC-OS film, for example.

For example, the CAAC-OS film is formed by a sputtering method with a polycrystalline metal oxide target. When ions collide with the sputtering target, a crystal region included in the sputtering target may be separated from the target along an a-b plane; in other words, a sputtered particle having a plane parallel to an a-b plane (flat-plate-like sputtered particle or pellet-like sputtered particle) may flake off from the sputtering target. In that case, the flat-plate-like sputtered particle reaches a substrate while maintaining their crystal state, whereby the CAAC-OS film can be formed.

For the deposition of the CAAC-OS film, the following conditions are preferably used.

By reducing the amount of impurities entering the CAAC-OS film during the deposition, the crystal state can be prevented from being broken by the impurities. For example, the concentration of impurities (e.g., hydrogen, water, carbon dioxide, or nitrogen) which exist in the deposition chamber may be reduced. Furthermore, the concentration of impurities in a deposition gas may be reduced. Specifically, a deposition gas whose dew point is −80° C. or lower, preferably −100° C. or lower is used.

By increasing the substrate heating temperature during the deposition, migration of a sputtered particle is likely to occur after the sputtered particle is attached to a substrate surface. Specifically, the substrate heating temperature during the deposition is higher than or equal to 100° C. and lower than or equal to 740° C., preferably higher than or equal to 200° C. and lower than or equal to 500° C. By increasing the substrate heating temperature during the deposition, when the flat-plate-like sputtered particle reaches the substrate, migration occurs on the substrate surface, so that a flat plane of the flat-plate-like sputtered particle is attached to the substrate.

Furthermore, it is preferable that the proportion of oxygen in the deposition gas be increased and the power be optimized in order to reduce plasma damage at the deposition. The proportion of oxygen in the deposition gas is 30 vol % or higher, preferably 100 vol %.

As an example of the metal oxide target for sputtering, an In—Ga—Zn—O compound target is described below.

The In—Ga—Zn—O compound target, which is polycrystalline, is made by mixing InO$_X$ powder, GaO$_Y$ powder, and ZnO$_Z$ powder in a predetermined ratio, applying pressure, and performing heat treatment at a temperature higher than or equal to 1000° C. and lower than or equal to 1500° C. Note that X, Y, and Z are each a given positive number. Here, the predetermined molar ratio of InO$_X$ powder to GaO$_Y$ powder and ZnO$_Z$ powder is, for example, 2:2:1, 8:4:3, 3:1:1, 1:1:1, 4:2:3, or 3:1:2. The kinds of powder and the molar ratio for mixing powder may be determined as appropriate depending on the desired sputtering target.

Note that the oxide semiconductor layer 408a may have different crystallinity from the oxide semiconductor layer 408b. Note that the CAAC-OS film is preferably applied to the oxide semiconductor layer 408b functioning as the channel of the transistor 300. In the case where the oxide semiconductor layer 408b is formed using the CAAC-OS film, a precursor might be oriented in the oxide semiconductor layer 408a provided on and in contact with the oxide semiconductor layer 408b, i.e., the precursor might have what is called orderliness, so that the oxide semiconductor layer 408a can be the CAAC-OS film. When the oxide semiconductor layer 408a provided on the back channel side is formed of an amorphous oxide semiconductor, oxygen vacancies are generated in etching treatment for forming the source electrode layer 410a and the drain electrode layer 410b, and accordingly the oxide semiconductor layer 408a is likely to be n-type. Therefore, it is preferable to apply a crystalline oxide semiconductor to the oxide semiconductor layer 408a.

Note that in this embodiment, the oxide semiconductor layer 408a and the oxide semiconductor layer 408b have the same constituent elements and form an oxide semiconductor stack. At this time, depending on materials or deposition conditions of the oxide semiconductor layers, the interfaces between the oxide semiconductor layers are unclear in some cases. Therefore, in FIGS. 1A to 1C, the interface between the oxide semiconductor layer 408a and the oxide semiconductor layer 408b is schematically denoted by a dotted line. The same applies to drawings mentioned below.

Figure 2A:
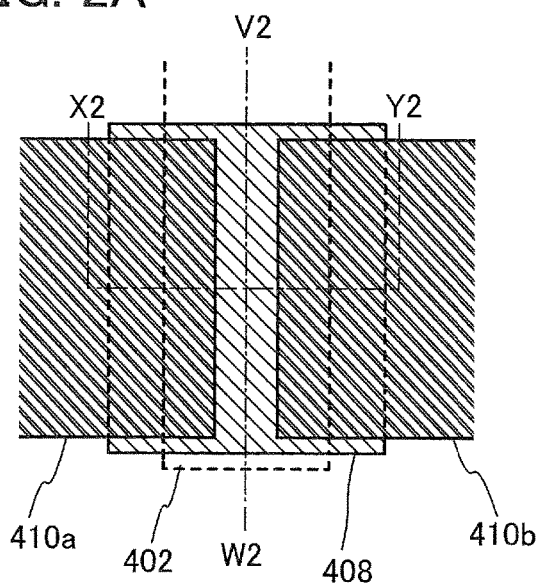
FIGS. 2A to 2D are a plan view, cross-sectional views, and a band diagram illustrating one embodiment of a semiconductor device.
Figure 2B:
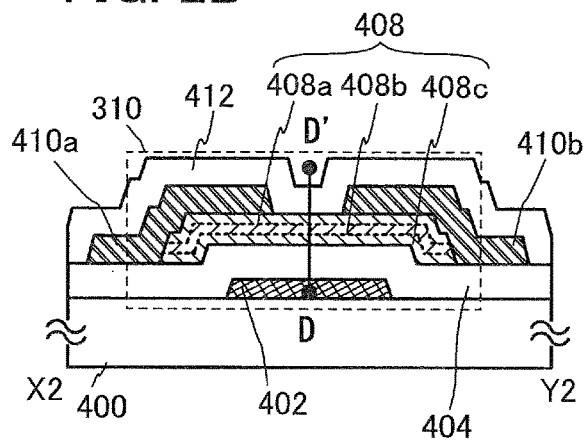
Figure 2C:
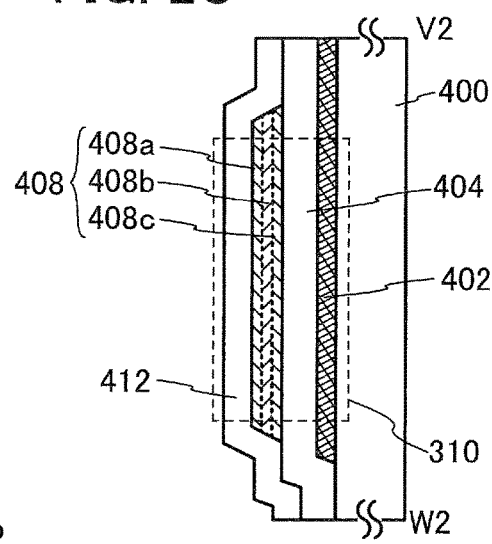

FIGS. 2A to 2C illustrate a structural example of a transistor 310. FIG. 2A is a plan view of the transistor 310, FIG. 2B is a cross-sectional view taken along a chain line X2-Y2 in FIG. 2A, and FIG. 2C is a cross-sectional view taken along a chain line V2-W2 in FIG. 2A. In a manner similar to the transistor 300 in FIGS. 1A to 1C, the transistor 310 in FIGS. 2A to 2C includes the gate electrode layer 402 provided over the substrate 400 having an insulating surface, the gate insulating layer 404 over the gate electrode layer 402, the oxide semiconductor stack 408 which is in contact with the gate insulating layer 404 and overlaps with the gate electrode layer 402, and the source electrode layer 410a and the drain electrode layer 410b which are electrically connected to the oxide semiconductor stack 408. Further, the insulating layer 412 which covers the source electrode layer 410a and the drain electrode layer 410b and is in contact with the oxide semiconductor stack 408 may be included as a component of the transistor 310.

The transistor 310 is different from the transistor 300 in that an oxide semiconductor layer 408c is provided between the oxide semiconductor layer 408b and the gate insulating layer 404. That is, in the transistor 310, the oxide semiconductor stack 408 includes a stacked structure of the oxide semiconductor layer 408a, the oxide semiconductor layer 408b, and the oxide semiconductor layer 408c.

Note that the transistor 310 has the same structure as the transistor 300 except the oxide semiconductor layer 408c; thus the description of the transistor 300 can be referred to.

By including the oxide semiconductor layer 408c between the gate insulating layer 404 and the oxide semiconductor layer 408b in which a channel is formed, the transistor 310 has a structure in which carriers flow through a region which is apart from the gate insulating layer 404 (what is called a buried channel). Accordingly, an interface between the gate insulating layer 404 and the channel can be stabilized and formation of a trap level at the interface can be prevented. Thus, degradation, in particular, photodegradation such as negative-bias temperature stress photodegradation of the transistor is prevented, so that the transistor can have high reliability.

In a metal oxide containing indium and gallium, as the ratio of the gallium content to the content of the other metal element becomes higher, the energy gap of the metal oxide is increased. In addition, owing to a difference in band gap between the oxide semiconductor layer 408c and the oxide semiconductor layer 408b, a conduction band offset is formed. Accordingly, it is preferable to use, as the oxide semiconductor layer 408c, a metal oxide in which the indium content is lower than or equal to the gallium content because the channel can be effectively formed in the oxide semiconductor layer 408b.

In the case where an In—Ga—Zn-based oxide semiconductor is used as the oxide semiconductor layer 408c, an In—Ga—Zn-based oxide having any of atomic ratios of In:Ga:Zn=1:1:1(=1/3:1/3:1/3), In:Ga:Zn=1:3:2 (=1/6:3/6:2/6), In:Ga:Zn=2:4:3 (=2/9:4/9:3/9), or In:Ga:Zn=1:5:3 (=1/9:5/9:3/9); or an oxide having an atomic ratio which is close to any of the above atomic ratios can be used. Note it is preferable to use a metal oxide in which the indium content is lower than or equal to the gallium content for both the oxide semiconductor layer 408a and the oxide semiconductor layer 408c. Here, the composition of the oxide semiconductor layer 408a may be either different from or the same as the composition of the oxide semiconductor layer 408c.

In general, an oxide semiconductor layer is mostly deposited by a sputtering method. On the other hand, when the oxide semiconductor layer is formed by sputtering, in some cases, an ionized rare gas element (e.g., argon) or a particle ejected from a surface of a sputtering target flicks off a particle of a film, such as a gate insulating film, on which the oxide semiconductor layer is to be formed. The particle flicked off from the film on which the oxide semiconductor layer is to be formed might enter the oxide semiconductor layer and functions as an impurity element therein. In particular, a portion of the oxide semiconductor layer, which is in the vicinity of the surface on which the oxide semiconductor layer is formed, might have high concentration of the impurity element. Further, when the impurity element remains in the vicinity of the surface where the oxide semiconductor layer is to be formed, the resistance of the oxide semiconductor layer is increased, which causes the electrical characteristics of the transistor to be lowered.

However, in the transistor 310 illustrated in FIGS. 2A to 2C, since the oxide semiconductor layer 408c is provided between the gate insulating layer 404 and the oxide semiconductor layer 408b in which the channel is formed, a constituent element of the gate insulating layer 404 can be prevented from diffusing to the channel. That is, the oxide semiconductor layer 408c may contain the constituent element (e.g., silicon) of the gate insulating layer 404 as an impurity. By including the oxide semiconductor layer 408c, the transistor 310 can have more stabilized electrical characteristics; thus, a highly reliable semiconductor device can be provided.

Figure 2D:
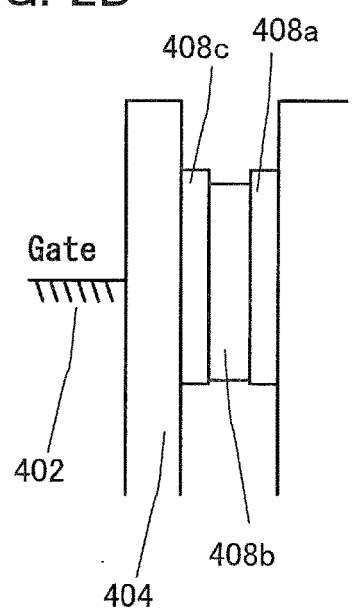

FIG. 2D is an energy band diagram in the thickness direction (D-D') in FIG. 2B. In this embodiment, the oxide semiconductor layers 408a to 408c are formed using In—Ga—Zn-based oxide semiconductors. Metal oxides in which the indium content is lower than or equal to the gallium content are used for the oxide semiconductor layer 408a and the oxide semiconductor layer 408c, and a metal oxide in which the indium content is higher than the gallium content is used for the oxide semiconductor layer 408b. Accordingly, the oxide semiconductor stack 408 described in this embodiment can have what is called a buried channel as shown in the energy band of FIG. 2D.

An example of a method for manufacturing the transistor 310 is described below with reference to FIGS. 3A to 3D.

First, the gate electrode layer 402 (including a wiring formed with the same layer) is formed over the substrate 400 having an insulating surface.

There is no particular limitation on the substrate that can be used as the substrate 400 having an insulating surface as long as it has heat resistance high enough to withstand heat treatment performed later. For example, a glass substrate of barium borosilicate glass, aluminoborosilicate glass, or the like, a ceramic substrate, a quartz substrate, or a sapphire substrate can be used. Alternatively, a single crystal semiconductor substrate or a polycrystalline semiconductor substrate made of silicon, silicon carbide, or the like, a compound semiconductor substrate made of silicon germanium or the like, an SOI substrate, or the like can be used. Furthermore, any of these substrates provided with a semiconductor element may be used as the substrate 400. Further alternatively, a base insulating layer may be formed over the substrate 400.

The gate electrode layer 402 can be formed using a metal material such as molybdenum, titanium, tantalum, tungsten, aluminum, copper, chromium, neodymium, or scandium, or an alloy material containing any of these materials as a main component. Alternatively, a semiconductor film typified by a polycrystalline silicon film doped with an impurity element such as phosphorus, or a silicide film such as a nickel silicide film may be used as the gate electrode layer 402. The gate electrode layer 402 may have a single-layer structure or a stacked-layer structure. The gate electrode layer 402 may have a tapered shape with a taper angle of greater than or equal to 15° and less than or equal to 70° for example. Here, the taper angle refers to an angle formed between a side surface of a layer having a tapered shape and a bottom surface of the layer.

The material of the gate electrode layer 402 may be a conductive material such as indium oxide-tin oxide, indium oxide containing tungsten oxide, indium zinc oxide containing tungsten oxide, indium oxide containing titanium oxide, indium tin oxide containing titanium oxide, indium oxide-zinc oxide, or indium tin oxide to which silicon oxide is added.

Alternatively, as the material of the gate electrode layer 402, an In—Ga—Zn-based oxide containing nitrogen, an In—Sn-based oxide containing nitrogen, an In—Ga-based oxide containing nitrogen, an In—Zn-based oxide containing nitrogen, an Sn-based oxide containing nitrogen, an In-based oxide containing nitrogen, or a metal nitride film (such as an indium nitride film, a zinc nitride film, a tantalum nitride film, or a tungsten nitride film) may be used. These materials have a work function of 5 eV or more. Therefore, when the gate electrode layer 402 is formed using any of these materials, the threshold voltage of the transistor can be positive, so that the transistor can be a normally-off switching transistor.

Figure 3A:
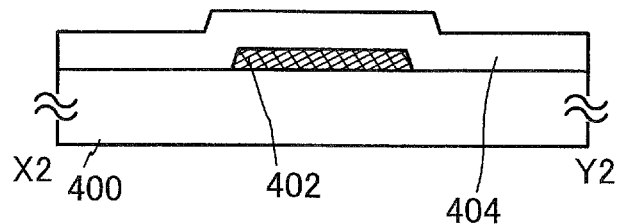
FIGS. 3A to 3D illustrate an example of a method for manufacturing a semiconductor device.

Next, the gate insulating layer 404 is formed so as to cover the gate electrode layer 402 (see FIG. 3A). As the gate insulating layer 404, a single layer or a stack of layers including at least one of the following films formed by a plasma CVD method, a sputtering method, or the like is used: a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, and a neodymium oxide film.

Note that it is preferable that a region which is included in the gate insulating layer 404 and is in contact with the oxide semiconductor stack 408 formed later be formed using an oxide insulating layer and it is further preferable that the region include an oxygen-excess region. In order to provide the oxygen-excess region in the gate insulating layer 404, the gate insulating layer 404 may be formed in an oxygen atmosphere, for example. Alternatively, oxygen may be introduced into the deposited gate insulating layer 404 to provide the oxygen-excess region. As a method for introducing oxygen, an ion implantation method, an ion doping method, a plasma immersion ion implantation method, plasma treatment, or the like may be used.

Figure 3B:
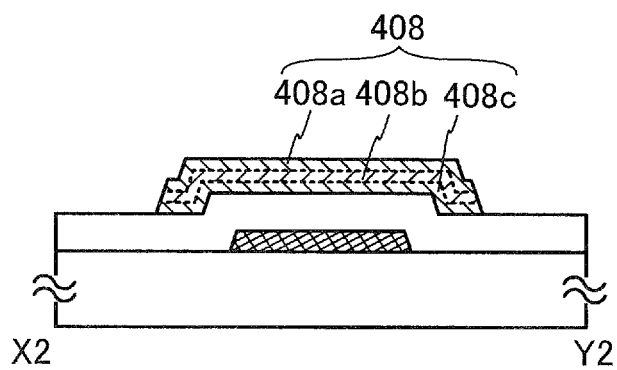

Next, an oxide semiconductor film to be the oxide semiconductor layer 408c, an oxide semiconductor film to be the oxide semiconductor layer 408b, and an oxide semiconductor film to be the oxide semiconductor layer 408a are deposited in this order over the gate insulating layer 404 and processed into an island shape by etching treatment using a photolithography method to form the oxide semiconductor stack 408 (see FIG. 3B).

The oxide semiconductor layer 408c, the oxide semiconductor layer 408b, and the oxide semiconductor layer 408a may be each an amorphous oxide semiconductor or a crystalline oxide semiconductor. However, it is preferable that the oxide semiconductor layer 408b functioning as the channel of the transistor 310 be a crystalline oxide semiconductor. The crystalline oxide semiconductor may be obtained by performing heat treatment on an amorphous oxide semiconductor. The heat treatment for crystallizing the amorphous oxide semiconductor is performed at a temperature higher than or equal to 250° C. and lower than or equal to 700° C., preferably higher than or equal to 400° C., further preferably higher than or equal to 500° C., still further preferably higher than or equal to 550° C. Note that the heat treatment can also serve as another heat treatment in the manufacturing process.

The oxide semiconductor films each can be formed by a sputtering method, a molecular beam epitaxy (MBE) method, a CVD method, a pulse laser deposition method, an atomic layer deposition (ALD) method, or the like as appropriate.

In the formation of the oxide semiconductor films, the hydrogen concentration in the oxide semiconductor films is preferably reduced as much as possible. In order to reduce the hydrogen concentration, for example, in the case where a sputtering method is used for the deposition, a high-purity rare gas (typically, argon) from which impurities such as hydrogen, water, a hydroxyl group, or a hydride have been removed; oxygen; or a mixed gas of oxygen and the rare gas is used as appropriate as an atmosphere gas supplied to a deposition chamber of a sputtering apparatus.

The oxide semiconductor films are formed in such a manner that a sputtering gas from which hydrogen and moisture have been removed is introduced into the deposition chamber while moisture remaining therein is removed, whereby the hydrogen concentration in the formed oxide semiconductor films can be reduced. In order to remove the residual moisture in the deposition chamber, an entrapment vacuum pump, for example, a cryopump, an ion pump, or a titanium sublimation pump is preferably used. The evacuation unit may be a turbo molecular pump provided with a cold trap. A cryopump has a high capability in removing a hydrogen molecule, a compound containing a hydrogen atom such as water ($H_2O$) (preferably, also a compound containing a carbon atom), and the like; therefore, the impurity concentration in the oxide semiconductor film formed in the deposition chamber which is evacuated using a cryopump can be reduced.

The gate insulating layer 404 and the oxide semiconductor films are preferably formed in succession without exposure to the air. By forming the gate insulating layer 404 and the oxide semiconductor films in succession without exposure to the air, attachment of hydrogen or a hydrogen compound (e.g., adsorption water) onto surfaces of the oxide semiconductor films can be prevented, and thus mixing of an impurity can be prevented.

Further, in the case where the oxide semiconductor film is formed by a sputtering method, the relative density (the fill rate) of a metal oxide target which is used for forming the oxide semiconductor film is greater than or equal to 90% and less than or equal to 100%, preferably greater than or equal to 95% and less than or equal to 99.9%. With the use of a metal oxide target with a high relative density, a dense oxide semiconductor film can be deposited.

Note that formation of the oxide semiconductor film while the substrate 400 is kept at high temperature is also effective in reducing the impurity concentration in the oxide semiconductor film. The temperature at which the substrate 400 is heated may be higher than or equal to 150° C. and lower than or equal to 450° C.; the substrate temperature is preferably higher than or equal to 200° C. and lower than or equal to 350° C. By heating the substrate at high temperature during the film formation, a crystalline oxide semiconductor film can be formed.

In the case where a CAAC-OS film is employed as the oxide semiconductor layer (e.g., the oxide semiconductor layer 408b), any of the following methods can be used for forming the CAAC-OS film, for example. One of the methods is to form an oxide semiconductor film at a deposition temperature higher than or equal to 200° C. and lower than or equal to 450° C., thereby obtaining c-axis alignment substantially perpendicular to a surface. Another method is to form a thin oxide semiconductor film and then subject the film to heat treatment at a temperature higher than or equal to 200° C. and lower than or equal to 700° C., thereby obtaining c-axis alignment substantially perpendicular to a surface. The other method is to form a first thin oxide semiconductor film, heat treatment is performed on the film at a temperature higher than or equal to 200° C. and lower than or equal to 700° C., and then form a second oxide semiconductor film, thereby obtaining c-axis alignment substantially perpendicular to a surface.

Oxide semiconductors used for the oxide semiconductor layers 408a to 408c contain at least indium (In). In particular, indium and zinc (Zn) are preferably contained. As a stabilizer for reducing variation in electric characteristics of a transistor using the oxide semiconductor, gallium (Ga) is preferably additionally contained.

Further, as described above, it is preferable that the oxide semiconductor layer 408a and the oxide semiconductor layer 408c functioning buffer layers for reducing influence of a trap level be each formed using a metal oxide in which the indium content is lower than or equal to the gallium content, and the oxide semiconductor layer 408b serving as a channel formation region be formed using a metal oxide in which the indium content is higher than the gallium content.

As a stabilizer, one or more of tin (Sn), hafnium (Hf), aluminum (Al), and zirconium (Zr) may be contained instead of gallium (Ga) or in addition to gallium (Ga). As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, any of the following can be used: a single-component metal oxide such as indium oxide, tin oxide, or zinc oxide; a two-component metal oxide such as an In—Zn-based oxide, an In—Mg-based oxide, or an In—Ga-based oxide; a three-component metal oxide such as an In—Ga—Zn-based oxide, an In—Al—Zn-based oxide, an In—Sn—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; and a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide.

For example, an "In—Ga—Zn-based oxide" means an oxide containing In, Ga, and Zn as its main components and there is no particular limitation on the ratio of In, Ga, and Zn. The In—Ga—Zn-based oxide may contain a metal element other than the In, Ga, and Zn.

Alternatively, a material represented by $InMO_3(ZnO)_m$ (m>0 is satisfied, and m is not an integer) may be used as an oxide semiconductor. Note that M represents one or more metal elements selected from Ga, Fe, Mn, and Co. Alternatively, as the oxide semiconductor, a material expressed by a chemical formula, $In_2SnO_5(ZnO)_n$ (n>0, n is a natural number) may be used.

Further, the oxide semiconductor stack 408 is preferably subjected to heat treatment for removing excess hydrogen (including water and a hydroxyl group) contained in the films (for dehydration or dehydrogenation). The temperature of the heat treatment is higher than or equal to 300° C. and lower than or equal to 700° C., or lower than the strain point of the substrate. The heat treatment can be performed under reduced pressure, a nitrogen atmosphere, or the like. Hydrogen, which is an impurity imparting n-type conductivity, can be removed by the heat treatment.

Note that the heat treatment for the dehydration or dehydrogenation may be performed at any timing in the manufacturing process of the transistor as long as it is performed after the formation of the oxide semiconductor films. The heat treatment for dehydration or dehydrogenation may be performed a plurality of times, and may also serve as another heat treatment.

In the heat treatment, it is preferable that water, hydrogen, or the like be not contained in nitrogen or a rare gas such as helium, neon, or argon. The purity of nitrogen or the rare gas such as helium, neon, or argon which is introduced into the heat treatment apparatus is set to preferably 6N (99.9999%) or higher, further preferably 7N (99.99999%) or higher (that is, the impurity concentration is preferably 1 ppm or lower, further preferably 0.1 ppm or lower).

In addition, after the oxide semiconductor layers (or the oxide semiconductor stack) are heated by the heat treatment, a high-purity oxygen gas, a high-purity dinitrogen gas, or ultra dry air (the moisture amount is less than or equal to 20 ppm (−55° C. by conversion into a dew point), preferably less than or equal to 1 ppm, further preferably less than or equal to 10 ppb, in the measurement with use of a dew point meter of a cavity ring down laser spectroscopy (CRDS) system) may be introduced into the same furnace while the heating temperature is being maintained or being gradually decreased. It is preferable that water, hydrogen, or the like be not contained in the oxygen gas or the dinitrogen monoxide gas. The purity of the oxygen gas or the dinitrogen monoxide gas which is introduced into the heat treatment apparatus is preferably 6N or more, further preferably 7N or more (i.e., the impurity concentration in the oxygen gas or the dinitrogen monoxide gas is preferably 1 ppm or lower, further preferably 0.1 ppm or lower). The oxygen gas or the dinitrogen monoxide gas acts to supply oxygen that is a main component of the oxide semiconductor and that has been reduced by the step of removing an impurity for the dehydration or dehydrogenation, so that the oxide semiconductor layers can have high purity and be i-type (intrinsic) oxide semiconductor layers.

Since there is a possibility that oxygen is also released and reduced by dehydration or dehydrogenation treatment, oxygen (including at least one of an oxygen radical, an oxygen atom, and an oxygen ion) may be introduced into the oxide semiconductor layers which have been subjected to the dehydration or dehydrogenation treatment to supply oxygen to the layers.

Introduction (supply) of oxygen into the dehydrated or dehydrogenated oxide semiconductor layers enables the oxide semiconductor layers to be highly purified and to be i-type (intrinsic). Variation in electric characteristics of a transistor having the highly-purified and i-type (intrinsic) oxide semiconductor is suppressed, and the transistor is electrically stable.

In the case where oxygen is introduced into the oxide semiconductor layers, oxygen may be directly introduced into the oxide semiconductor layers or may be introduced into the oxide semiconductor layers through an insulating layer formed in a later step. As the method for adding oxygen (containing at least one of an oxygen radical, an oxygen atom, and an oxygen ion), an ion implantation method, an ion doping method, a plasma immersion ion implantation method, plasma treatment, or the like can be used. A gas containing oxygen can be used for oxygen introducing treatment. As the gas containing oxygen, oxygen, dinitrogen monoxide, nitrogen dioxide, carbon dioxide, carbon monoxide, and the like can be used. Further, a rare gas may be contained in the gas containing oxygen in the oxygen introducing treatment.

For example, in the case where an oxygen ion is introduced into the oxide semiconductor layers by an ion implantation method, the dose can be greater than or equal to $1 \times 10^{13}$ ions/cm$^2$ and less than or equal to $5 \times 10^{16}$ ions/cm$^2$.

The timing of supply of oxygen to the oxide semiconductor layers is not particularly limited to the above as long as it is after the formation of the oxide semiconductor films. Oxygen may be introduced into the oxide semiconductor layers plural times.

Figure 3C:
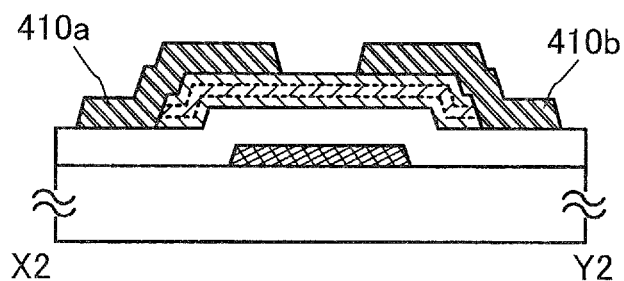

Then, a conductive film is formed over the oxide semiconductor stack 408 and processed to form the source electrode layer 410a and the drain electrode layer 410b (including a wiring formed with the same layer) (see FIG. 3C).

For the source electrode layer 410a and the drain electrode layer 410b, a metal film containing an element selected from Al, Cr, Cu, Ta, Ti, Mo, and W, a metal nitride film containing any of the above elements as a component (a titanium nitride film, a molybdenum nitride film, or a tungsten nitride film), or the like can be used, for example. Alternatively, a film of a high-melting-point metal such as Ti, Mo, or W or a metal nitride film of any of these elements (a titanium nitride film, a molybdenum nitride film, or a tungsten nitride film) may be stacked on one of or both a bottom side and a top side of a metal film of Al, Cu, or the like. Alternatively, the source electrode layer 410a and the drain electrode layer 410b may be formed using a conductive metal oxide. As the conductive metal oxide, indium oxide ($In_2O_3$), tin oxide ($SnO_2$), zinc oxide (ZnO), indium oxide-tin oxide ($In_2O_3$—$SnO_2$), indium oxide-zinc oxide ($In_2O_3$—ZnO), or any of these metal oxide materials in which silicon oxide is contained can be used.

For the source electrode layer 410a and the drain electrode layer 410b, a metal nitride film such as an In—Ga—Zn—O film containing nitrogen, an In—Sn—O film containing nitrogen, an In—Ga—O film containing nitrogen, an In—Zn—O film containing nitrogen, a Sn—O film containing nitrogen, or an In—O film containing nitrogen can be used. These films contain the same constituent elements as the oxide semiconductor stack 408 and can therefore stabilize the interface with the oxide semiconductor stack 408.

Note that it is preferable to use a conductive film containing copper for the source electrode layer 410a and the drain electrode layer 410b because wiring resistance can be reduced. In general, copper easily diffuses into a semiconductor or a silicon oxide film, and thus the operation of a semiconductor device might be unstable and yield might be significantly reduced. However, in the transistor 310, since the oxide semiconductor layer 408a serving as a buffer layer for preventing the constituent element (that is copper here) of the electrode layers is provided in contact with the source electrode layer 410a and the drain electrode layer 410b, influence of the trap level on the back channel side which is generated owing to diffusion of copper can be reduced, preferably can be eliminated.

Figure 3D:
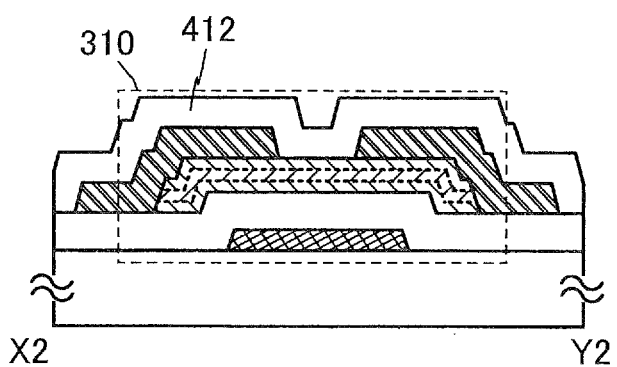

Next, the insulating layer 412 is formed to cover the source electrode layer 410a, the drain electrode layer 410b, and the exposed oxide semiconductor stack 408 (see FIG. 3D).

The insulating layer 412 can be formed using a single layer or a stack of layers of one or more of the following films formed by a plasma CVD method or a sputtering method: a silicon oxide film, a gallium oxide film, an aluminum oxide film, a silicon nitride film, a silicon oxynitride film, an aluminum oxynitride film, a silicon nitride oxide film, and the like. However, it is preferable that an oxide insulating layer be formed as the insulating layer 412 because the oxide insulating layer can supply oxygen to the oxide semiconductor stack 408.

Heat treatment may be performed after the insulating layer 412 is formed. A temperature of the heat treatment is preferably higher than or equal to 200° C., and for example, 220° C.

Through the above steps, the transistor 310 of this embodiment can be formed.

The transistor of this embodiment includes the first oxide semiconductor layer which serves as a buffer layer for preventing diffusion of the constituent element of the source electrode layer and the drain electrode layer into the channel and the second oxide semiconductor layer which serves as the channel. With such a structure, influence of an interface state which can be formed on the back channel side of the transistor can be reduced. Further, it is preferable that the transistor described in this embodiment further include the third oxide semiconductor layer which is provided between the oxide semiconductor layer serving as the channel and the gate insulating layer and serves as a buffer layer for preventing degradation of an interface on the gate insulating layer side of the channel. When the third oxide semiconductor layer is provided in the transistor, photodegradation (e.g., negative-bias temperature stress photodegradation) of the transistor can be reduced, so that a highly reliable semiconductor device can be provided.

The methods and structures described in this embodiment can be combined as appropriate with any of the methods and structures described in the other embodiments.

Embodiment 2

In this embodiment, an embodiment of a semiconductor device which is different from that in Embodiment 1 will be described with reference to FIGS. 10A and 10B. Specifically, transistors each including a gate insulating layer with a structure which is different from that of the transistor of Embodiment 1 are described.

Figure 10A:
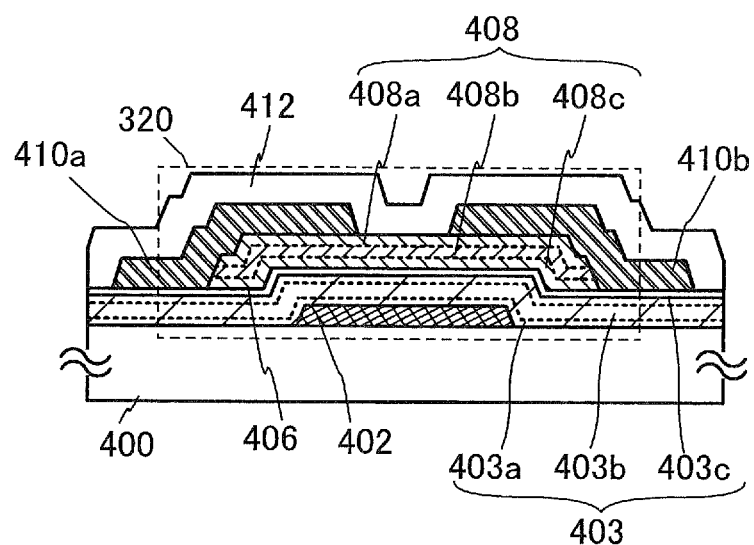
FIGS. 10A and 10B are cross-sectional views each illustrating one embodiment of a semiconductor device.

A structural example of a transistor 320 is illustrated in FIG. 10A. In a manner similar to the transistor 310 in FIGS. 2A to 2D, the transistor 320 in FIG. 10A includes the gate electrode layer 402 provided over the substrate 400 having an insulating surface, the gate insulating layer 403 and 406 over the gate electrode layer 402, the oxide semiconductor stack 408 which is in contact with the gate insulating layer 406 and overlaps with the gate electrode layer 402, and the source electrode layer 410a and the drain electrode layer 410b which are electrically connected to the oxide semiconductor stack 408. In the transistor 320, the oxide semiconductor stack 408 includes the oxide semiconductor layer 408c in contact with the gate insulating layer 406, the oxide semiconductor layer 408b on and in contact with the oxide semiconductor layer 408c, and the oxide semiconductor layer 408a on and in contact with the oxide semiconductor layer 408b and in contact with the source electrode layer 410a and the drain electrode layer 410b. Further, the insulating layer 412 which covers the source electrode layer 410a and the drain electrode layer 410b and is in contact with the oxide semiconductor stack 408 may be included as a component of the transistor 320.

The transistor 320 is different from the transistor 310 in that the gate insulating layer has a structure in which a first gate insulating layer 403 which includes gate insulating layers 403a, 403b, and 403c, and a second gate insulating layer 406 are stacked from the gate electrode layer 402 side.

Note that the transistor 320 has the same structure as the transistor 310 except the gate insulating layer; therefore, the description of the transistor 310 can be referred to.

In the transistor 320, a nitrogen-containing silicon film is applied to the first gate insulating layer 403. A nitrogen-containing silicon film has higher relative permittivity than a silicon oxide film and needs to have a larger thickness than a silicon oxide film to obtain the same electrostatic capacity; thus, it is possible to physically increase the thickness of the gate insulating layer. Accordingly, a reduction in withstand voltage of the transistor 320 is prevented and further the withstand voltage is improved, so that electrostatic breakdown of the semiconductor device can be prevented.

Further, as the second gate insulating layer 406 in contact with the oxide semiconductor stack 408, an insulating layer containing oxygen, such as a silicon oxide film, a gallium oxide film, or an aluminum oxide film, is used. It is further preferable that the second gate insulating layer 406 include a region which contains oxygen in a proportion higher than that of oxygen in the stoichiometric composition (i.e., an oxygen-excess region). This is because when the insulating layer in contact with the oxide semiconductor stack 408 includes an oxygen-excess region, oxygen can be supplied to the oxide semiconductor stack 408 and thus oxygen can be prevented from being released from the oxide semiconductor stack 408, and oxygen vacancies in the oxide semiconductor stack 408 can be filled. In order to provide the oxygen-excess region in the second gate insulating layer 406, the second gate insulating layer 406 is formed in an oxygen atmosphere, for example. Alternatively, oxygen may be introduced into the deposited second gate insulating layer 406 to provide the oxygen-excess region therein.

A silicon nitride film, a silicon nitride oxide film, and a silicon oxynitride film can be given as examples of the nitrogen-containing silicon film which is applied to the first gate insulating layer 403. However, as the ratio of the nitrogen content to the oxygen content becomes higher, relative permittivity is increased and thus a silicon nitride film is preferably used. Further, the energy gap of silicon nitride is as small as 5.5 eV whereas the energy gap of silicon oxide is 8 eV, and the specific resistance of silicon nitride is small accordingly; therefore, use of a silicon nitride film can lead to high electrostatic discharge (ESD) resistance. Note that in this specification, a "silicon oxynitride film" refers to a film that includes more oxygen than nitrogen, and a "silicon nitride oxide film" refers to a film that includes more nitrogen than oxygen.

The gate insulating layer 403a in contact with the gate electrode layer 402 is a silicon film which contains a smaller amount of ammonia than at least the gate insulating layer 403b. Ammonia serves as a ligand of a metal complex owing to a function of a lone electron-pair on a nitrogen atom. Therefore, for example, in the case where copper is used for the gate electrode layer 402, when a gate insulating layer containing a large amount of ammonia is provided in contact with the gate electrode layer, the copper might diffuse into the gate insulating layer owing to reaction represented by Formula (1) described below.

[Formula 1]

$$Cu^{2+} + 4NH_3 \Leftrightarrow [Cu(NH_3)_4]^{2+} \quad (1)$$

When the gate insulating layer 403a containing a small amount of ammonia (a smaller amount ammonia than at least the gate insulating layer 403b) is provided in contact with the gate electrode layer 402 in the transistor 320, a material (e.g., copper) of the gate electrode layer 402 can be prevented from diffusing into the first gate insulating layer 403. In other words, the gate insulating layer 403a can function as a barrier film against a metal material included in the gate electrode layer 402. By including the gate insulating layer 403a, the transistor can have higher reliability.

As the gate insulating layer 403b, a nitrogen-containing silicon film which has a larger thickness than the gate insulating layer 403a and in which the number of defects is reduced is used. For example, the gate insulating layer 403b has a thickness greater than or equal to 300 nm and less than or equal to 400 nm. Further, in the nitrogen-containing silicon film to be used as the gate insulating layer 403b, the spin density of a signal which appears in the Nc center (the g value is 2.003) of signals measured by electron spin resonance (ESR) is preferably less than or equal to $1 \times 10^{17}$ spins/cm$^3$ and further preferably less than or equal to $5 \times 10^{16}$ spins/cm$^3$. As described above, by providing a nitrogen-containing silicon film having a large thickness (e.g., 300 nm or more) in which the number of defects is reduced, it is possible that the gate insulating layer 403b has an ESD resistance of 300 V or more.

As the gate insulating layer 403c, a nitrogen-containing silicon film in which the hydrogen concentration is reduced is used. The hydrogen concentration of the gate insulating layer 403c is lower than at least that of the gate insulating layer 403b. For example, in the case where the gate insulating layer 403c is deposited by a plasma CVD method, the hydrogen concentration contained in a supply gas is reduced to lower than the hydrogen concentration of a supply gas used for depositing the gate insulating layer 403b, whereby the hydrogen concentration of the gate insulating layer 403c can be lower than that of gate insulating layer 403b. Specifically, in the case where silicon nitride films are formed as the gate insulating layer 403b and the gate insulating layer 403c, the gate insulating layer 403c may be deposited using a supply gas containing a smaller amount of ammonia than a supply gas for depositing the gate insulating layer 403b or may be deposited without using ammonia.

When a silicon nitride film in which the hydrogen concentration is reduced is provided as the gate insulating layer 403c, the amount of hydrogen or a hydrogen compound (e.g., water) which is mixed into the second gate insulating layer 406 and the oxide semiconductor stack 408 can be reduced. Part of hydrogen serves as a donor by being bonded to an oxide semiconductor and electrons serving as carriers are generated, which causes the threshold voltage of the transistor to be changed (shifted) in the negative direction. Accordingly, by including a silicon nitride film in which the hydrogen concentration is reduced as the gate insulating layer 403c, the transistor can have stabilized electrical characteristics. Further, by being provided as the gate insulating layer 403c, the silicon nitride film in which the hydrogen concentration is reduced has an effect as a barrier film for preventing impurities such as hydrogen and a hydrogen compound included in the gate insulating layer 403b from diffusing into the oxide semiconductor stack 408.

In this embodiment, silicon nitride films are used as the gate insulating layer 403a, the gate insulating layer 403b, and the gate insulating layer 403c which are included in the first gate insulating layer 403; and a silicon oxynitride film is used as the second gate insulating layer 406. The gate insulating layers are formed successively by a plasma CVD method. Specifically, a mixed gas of silane ($SiH_4$) and nitrogen ($N_2$) is supplied and a silicon nitride film to be the gate insulating layer 403a is deposited; the supply gas is switched to a mixed gas of silane ($SiH_4$), nitrogen ($N_2$), and ammonia ($NH_3$) and a silicon nitride film to be the gate insulating layer 403b is deposited; then the supply gas is switched to a mixed gas of silane ($SiH_4$) and nitrogen ($N_2$) and a silicon nitride film to be the gate insulating layer 403c is deposited; and then the supply gas is switched to a mixed gas of silane ($SiH_4$) and dinitrogen monoxide ($N_2O$) and a silicon oxynitride film to be the second gate insulating layer 406 is deposited.

The gate insulating layer 403a preferably has a thickness greater than or equal to 30 nm and less than or equal to 100 nm and further preferably has a thickness greater than or equal to 30 nm and less than or equal to 50 nm. The gate insulating layer 403b, which is provided as a countermeasure against electrostatic breakdown of the transistor, preferably has a thickness greater than or equal to 300 nm and less than or equal to 400 nm. The gate insulating layer 403c, which functions as a barrier film for preventing diffusion of hydrogen into the oxide semiconductor stack 408, preferably has a thickness greater than or equal to 25 nm and less than or equal to 150 nm. The second gate insulating layer 406 preferably has a thickness greater than or equal to 25 nm and less than or equal to 100 nm. Note that the thickness of each of the gate insulating layers is preferably adjusted so that the total of the thickness of the first gate insulating layer 403 (the total thickness of the gate insulating layer 403a, the gate insulating layer 403b, and the gate insulating layer 403c) and the thickness of the second gate insulating layer 406 is greater than or equal to 355 nm and less than or equal to 550 nm.

Figure 10B:
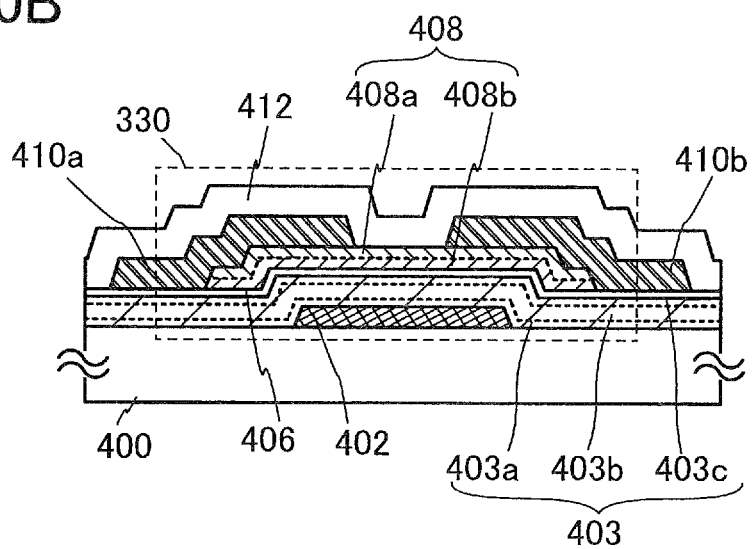

Note that as in a transistor 330 illustrated in FIG. 10B, the gate insulating layer formed of a stack of the first gate insulating layer 403 and the second gate insulating layer 406 and the oxide semiconductor stack 408 formed of a stack of the oxide semiconductor layer 408b and the oxide semiconductor layer 408a can be used in combination.

The transistor of this embodiment includes the first oxide semiconductor layer which serves as a buffer layer for preventing diffusion of the constituent element of the source electrode layer and the drain electrode layer into the channel and the second oxide semiconductor layer which serves as the channel. With such a structure, influence of an interface state which can be formed on the back channel side of the transistor can be reduced. Further, it is preferable that the transistor described in this embodiment further include the third oxide semiconductor layer which is provided between the oxide semiconductor layer serving as the channel and the gate insulating layer and serves as a buffer layer for preventing degradation of an interface on the gate insulating layer side of the channel. When the third oxide semiconductor layer is provided in the transistor, photodegradation (e.g., negative-bias temperature stress photodegradation) of the transistor can be reduced, so that a highly reliable semiconductor device can be provided.

Further, the transistor of this embodiment has, as the gate insulating layer, a stacked structure which is formed of a first gate insulating layer including a nitrogen-containing silicon film functioning as a barrier film against a constituent element (e.g., copper) of a gate electrode layer, a nitrogen-containing silicon film having a large thickness (e.g., 300 nm) in which the number of defects is reduced, and a nitrogen-containing silicon film having a blocking property against hydrogen; and a second gate insulating layer containing oxygen. Accordingly, in the transistor of this embodiment, variations in the electrical characteristics and electrostatic breakdown are prevented. By including such a transistor, a semiconductor device can have high reliability, and the semiconductor device can be provided in a high yield.

The methods and structures described in this embodiment can be combined as appropriate with any of the methods and structures described in the other embodiments.

Embodiment 3

A semiconductor device having a display function (also referred to as a display device) can be manufactured using the transistor described in Embodiment 1 or 2. Further, part or all of the driver circuitry which includes the transistor can be formed over a substrate where a pixel portion is formed, whereby a system-on-panel can be formed.

Figure 4A:
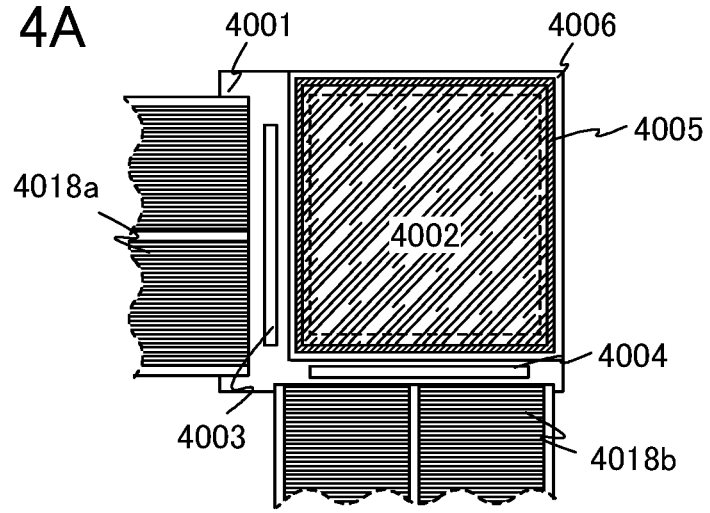
FIGS. 4A to 4C each illustrate one embodiment of a semiconductor device.

In FIG. 4A, a sealant 4005 is provided so as to surround a pixel portion 4002 provided over a substrate 4001, and the pixel portion 4002 is sealed with a substrate 4006. In FIG. 4A, a scan line driver circuit 4004 and a signal line driver circuit 4003 which are each formed using a single crystal semiconductor film or a polycrystalline semiconductor film over an IC chip or a substrate separately prepared are mounted on the substrate 4001, in a region that is different from the region surrounded by the sealant 4005. Various signals and potentials which are provided to the pixel portion 4002 through the signal line driver circuit 4003 and the scan line driver circuit 4004 are supplied from flexible printed circuits (FPCs) 4018a and 4018b.

Figure 4B:
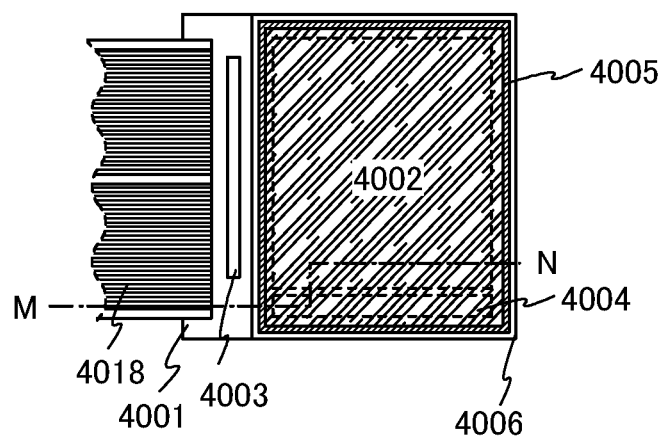
Figure 4C:
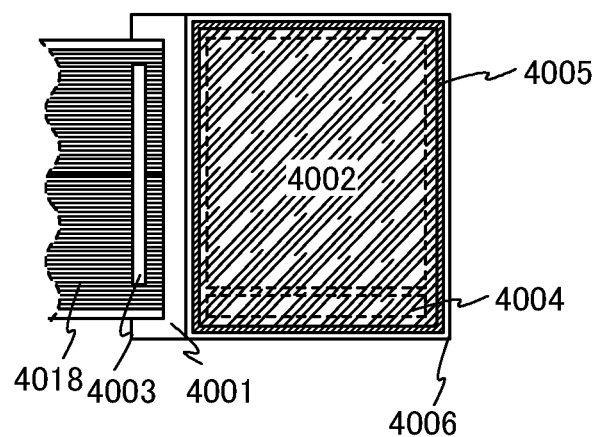

In FIGS. 4B and 4C, the sealant 4005 is provided to surround the pixel portion 4002 and the scan line driver circuit 4004 which are provided over the substrate 4001. The substrate 4006 is provided over the pixel portion 4002 and the scan line driver circuit 4004. Consequently, the pixel portion 4002 and the scan line driver circuit 4004 are sealed together with a display element by the substrate 4001, the sealant 4005, and the substrate 4006. In FIGS. 4B and 4C, the signal line driver circuit 4003 which is formed using a single crystal semiconductor film or a polycrystalline semiconductor film over an IC chip or a substrate separately prepared is mounted on the substrate 4001, in a region that is different from the region surrounded by the sealant 4005. In FIGS. 4B and 4C, various signals and potentials which are provided to the pixel portion 4002 through the signal line driver circuit 4003 and the scan line driver circuit 4004 are supplied from an FPC 4018.

Although FIGS. 4B and 4C each illustrate an example in which the signal line driver circuit 4003 is formed separately and mounted on the substrate 4001, one embodiment of the present invention is not limited to this structure. The scan line driver circuit may be separately formed and then mounted, or only part of the signal line driver circuit or part of the scan line driver circuit may be separately formed and then mounted.

Note that a connection method of a separately formed driver circuit is not particularly limited, and a chip on glass (COG) method, a wire bonding method, a tape automated bonding (TAB) method or the like can be used. FIG. 4A shows an example in which the signal line driver circuit 4003 and the scan line driver circuit 4004 are mounted by a COG method. FIG. 4B shows an example in which the signal line driver circuit 4003 is mounted by a COG method. FIG. 4C shows an example in which the signal line driver circuit 4003 is mounted by a TAB method.

Note that the display device includes a panel in which the display element is sealed, and a module in which an IC including a controller or the like is mounted on the panel. Specifically, a display device in this specification means an image display device, a display device, or a light source (including a lighting device). Furthermore, the display device also includes the following modules in its category: a module to which a connector such as an FPC or a TCP is attached; a module having a TCP at the tip of which a printed wiring board is provided; and a module in which an integrated circuit (IC) is directly mounted on a display element by a COG method.

The pixel portion and the scan line driver circuit provided over the substrate include a plurality of transistors, and the transistor described in Embodiment 1 or 2 can be applied thereto.

As the display element provided in the display device, a liquid crystal element (also referred to as a liquid crystal display element) or a light-emitting element (also referred to as a light-emitting display element) can be used. The light-emitting element includes an element with luminance which is controlled by current or voltage, in its category, and specifically includes an inorganic electroluminescent (EL) element, an organic EL element, and the like. Furthermore, a display medium whose contrast is changed by an electric effect, such as an electronic ink display device (electronic paper), can be used.

Figure 5:
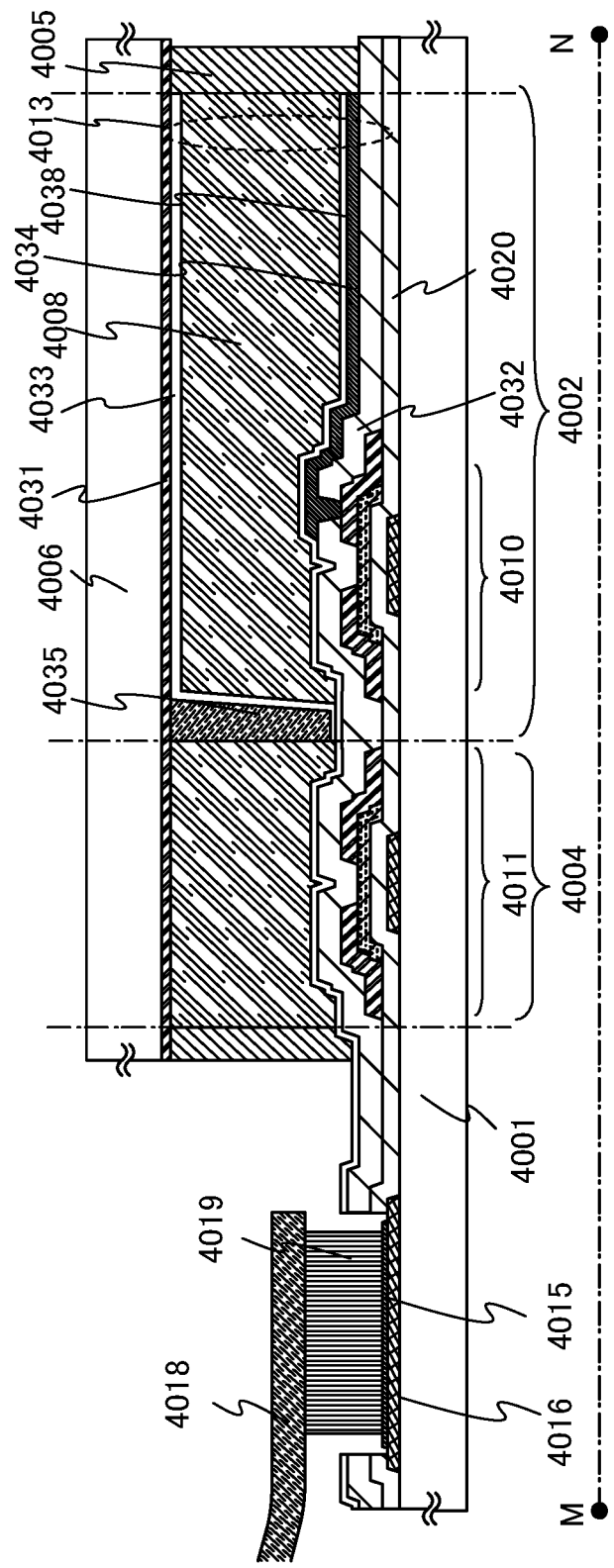
FIG. 5 illustrates one embodiment of a semiconductor device.

Embodiments of the semiconductor device are described with reference to FIGS. 4A to 4C and FIG. 5. FIG. 5 corresponds to a cross-sectional view along a line M-N in FIG. 4B. An example of a liquid crystal display device using a liquid crystal element as a display element is illustrated in FIG. 5.

Note that there is no limitation on the display device as long as the transistor 4010 provided in the pixel portion 4002 is electrically connected to the display element and the display element can perform display, and a variety of display elements can be used.

As illustrated in FIGS. 4A to 4C and FIG. 5, the semiconductor device includes a connection terminal electrode 4015 and a terminal electrode 4016, and the connection terminal electrode 4015 and the terminal electrode 4016 are electrically connected to a terminal included in the FPC 4018 (4018a or 4018b) through an anisotropic conductive layer 4019.

The connection terminal electrode 4015 is formed from the same conductive layer as a first electrode layer 4034. The terminal electrode 4016 is formed from the same conductive layer as a source electrode layer and a drain electrode layer of the transistor 4010 and a transistor 4011.

The pixel portion 4002 and the scan line driver circuit 4004 provided over the substrate 4001 include a plurality of transistors. FIGS. 4A to 4C and FIG. 5 illustrate the transistor 4010 included in the pixel portion 4002 and the transistor 4011 included in the scan line driver circuit 4004. In FIG. 5, an insulating layer 4032 is provided over the transistors 4010 and 4011.

The transistor described in Embodiment 1 or 2 can be applied to the transistor 4010 and the transistor 4011. In this embodiment, an example in which a transistor having a structure similar to that of the transistor 310 described in Embodiment 1 is used is described. The transistors 4010 and 4011 are bottom-gate transistors.

Each of the transistors 4010 and 4011 includes a first oxide semiconductor layer which functions as a buffer layer for preventing diffusion of a constituent element of the source and drain electrode layers in to a channel, a second oxide semiconductor layer which functions as the channel, and a third oxide semiconductor layer which is provided between a gate insulating layer and the oxide semiconductor layer functioning as the channel and functions as a buffer layer for preventing degradation of the interface on the gate insulating layer side of the channel. Accordingly, the transistors 4010 and 4011 are each a highly reliable transistor in which influence of an interface state which can be formed on the back channel side is reduced and photodegradation (e.g., negative-bias temperature stress photodegradation) is reduced.

Moreover, a conductive layer may be provided so as to overlap with a channel formation region of the oxide semiconductor layer of the transistor 4011 for the driver circuit. When the conductive layer is provided so as to overlap with the channel formation region of the oxide semiconductor layer, the amount of change in the threshold voltage of the transistor 4011 can be further reduced. The conductive layer may have the same potential as or a potential different from that of a gate electrode layer of the transistor 4011, and can function as a second gate electrode layer. Alternatively, the potential of the conductive layer may be in a floating state.

The conductive layer also functions to block an external electric field, that is, to prevent an external electric field (particularly, to prevent static electricity) from effecting the inside (a circuit portion including a transistor). A blocking function of the conductive layer can prevent the variation in electrical characteristics of the transistor due to the effect of external electric field such as static electricity.

In FIG. 5, a liquid crystal element 4013 includes a first electrode layer 4034, a second electrode layer 4031, and a liquid crystal layer 4008. Note that insulating layers 4033 and 4038 functioning as alignment films are provided so that the liquid crystal layer 4008 is positioned therebetween. The second electrode layer 4031 is provided on the substrate 4006 side, and the first electrode layer 4034 and the second electrode layer 4031 are stacked with the liquid crystal layer 4008 provided therebetween.

The first electrode layer 4034 and the second electrode layer 4031 can be formed using a light-transmitting conductive material such as indium oxide containing tungsten oxide, indium zinc oxide containing tungsten oxide, indium oxide containing titanium oxide, indium tin oxide containing titanium oxide, indium tin oxide, indium zinc oxide, indium tin oxide to which silicon oxide is added, or graphene.

Alternatively, the first electrode layer 4034 and the second electrode layer 4031 can be formed using one or more materials selected from metals such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), and silver (Ag); an alloy of any of these metals; and a nitride of any of these metals.

A conductive composition containing a conductive high molecule (also referred to as a conductive polymer) can be used for the first electrode layer 4034 and the second electrode layer 4031. As the conductive high molecule, what is called a π-electron conjugated conductive polymer can be used. For example, polyaniline or a derivative thereof, polypyrrole or a derivative thereof, polythiophene or a derivative thereof, a copolymer of two or more of aniline, pyrrole, and thiophene or a derivative thereof can be given.

A spacer 4035 is a columnar spacer obtained by selective etching of an insulating layer and is provided in order to control the thickness of the liquid crystal layer 4008 (a cell gap). Alternatively, a spherical spacer may be used.

In the case where a liquid crystal element is used as the display element, a thermotropic liquid crystal, a ferroelectric liquid crystal, an anti-ferroelectric liquid crystal, or the like can be used. These liquid crystal materials may be a low molecular compound or a high molecular compound. Such a liquid crystal material (liquid crystal composition) exhibits a cholesteric phase, a smectic phase, a cubic phase, a chiral nematic phase, an isotropic phase, or the like depending on conditions.

Alternatively, a liquid crystal composition exhibiting a blue phase for which an alignment film is unnecessary may be used for the liquid crystal layer 4008. In this case, the liquid crystal layer 4008 is in contact with the first electrode layer 4034 and the second electrode layer 4031. A blue phase is one of liquid crystal phases, which is generated just before a cholesteric phase changes into an isotropic phase while temperature of cholesteric liquid crystal is increased. The blue phase can be exhibited using a liquid crystal composition which is a mixture of a liquid crystal and a material. In order to increase the temperature range where the blue phase is exhibited, a liquid crystal layer may be formed by adding a polymerizable monomer, a polymerization initiator, and the like to a liquid crystal composition exhibiting a blue phase and by performing polymer stabilization treatment. The liquid crystal composition exhibiting a blue phase has a short response time, and has optical isotropy, which contributes to the exclusion of the alignment process and reduction of viewing angle dependence. In addition, since an alignment film does not need to be provided and rubbing treatment is unnecessary, electrostatic discharge damage caused by the rubbing treatment can be prevented and defects and damage of the liquid crystal display device can be reduced in the manufacturing process. Thus, productivity of the liquid crystal display device can be increased.

The specific resistivity of the liquid crystal material is greater than or equal to $1\times10^9$ Ω·cm, preferably greater than or equal to $1\times10^{11}$ Ω·cm, more preferably greater than or equal to $1\times10^{12}$ Ω·cm. Note that the specific resistance in this specification is measured at 20° C.

The size of storage capacitor formed in the liquid crystal display device is set considering the leakage current of the transistor provided in the pixel portion or the like so that charge can be held for a predetermined period. The size of the storage capacitor may be set considering the off-state current of a transistor or the like. By using a transistor including an oxide semiconductor layer, which is disclosed in this specification, it is enough to provide a storage capacitor having a capacitance that is ⅓ or less, preferably ⅕ or less of liquid crystal capacitance of each pixel.

In the transistor including an oxide semiconductor layer, which is disclosed in this specification, the current in an off state (off-state current) can be made small. Accordingly, an electric signal such as image data can be held for a longer period and a writing interval can be set longer. Accordingly, the frequency of refresh operation can be reduced, which leads to an effect of suppressing power consumption.

The transistor including an oxide semiconductor layer, which is disclosed in this specification, can have relatively high field-effect mobility; thus, the driver circuit can operate at high speed. For example, when such a transistor is used for a liquid crystal display device, a switching transistor in a pixel portion and a driver transistor in a driver circuit portion can be formed over one substrate. In addition, by using such a transistor in a pixel portion, a high-quality image can be provided.

For the liquid crystal display device, a twisted nematic (TN) mode, an in-plane-switching (IPS) mode, a fringe field switching (FFS) mode, an axially symmetric aligned microcell (ASM) mode, an optical compensated birefringence (OCB) mode, a ferroelectric liquid crystal (FLC) mode, an antiferroelectric liquid crystal (AFLC) mode, or the like can be used.

A normally black liquid crystal display device such as a transmissive liquid crystal display device utilizing a vertical alignment (VA) mode is preferable. Some examples are given as the vertical alignment mode. For example, a multi-domain vertical alignment (MVA) mode, a patterned vertical alignment (PVA) mode, an Advanced Super View (ASV) mode, and the like can be used. Furthermore, this embodiment can be applied to a VA liquid crystal display device. The VA liquid crystal display device has a kind of form in which alignment of liquid crystal molecules of a liquid crystal display panel is controlled. In the VA liquid crystal display device, liquid crystal molecules are aligned in a vertical direction with respect to a panel surface when no voltage is applied. Moreover, it is possible to use a method called domain multiplication or multi-domain design, in which a pixel is divided into some regions (subpixels) and molecules are aligned in different directions in their respective regions.

In the display device, a black matrix (a light-blocking layer), an optical member (an optical substrate) such as a polarizing member, a retardation member, or an anti-reflection member, and the like are provided as appropriate. For example, circular polarization may be obtained by using a polarizing substrate and a retardation substrate. In addition, a backlight, a side light, or the like may be used as a light source.

As a display method in the pixel portion, a progressive method, an interlace method or the like can be employed. Further, color elements controlled in a pixel at the time of color display are not limited to three colors: R, G, and B (R, G, and B correspond to red, green, and blue, respectively). For example, R, G, B, and W (W corresponds to white); R, G, B, and one or more of yellow, cyan, magenta, and the like; or the like can be used. Further, the sizes of display regions may be different between respective dots of color elements. Note that one embodiment of the disclosed invention is not limited to the application to a display device for color display; the disclosed invention can also be applied to a display device for monochrome display.

Figure 11A:
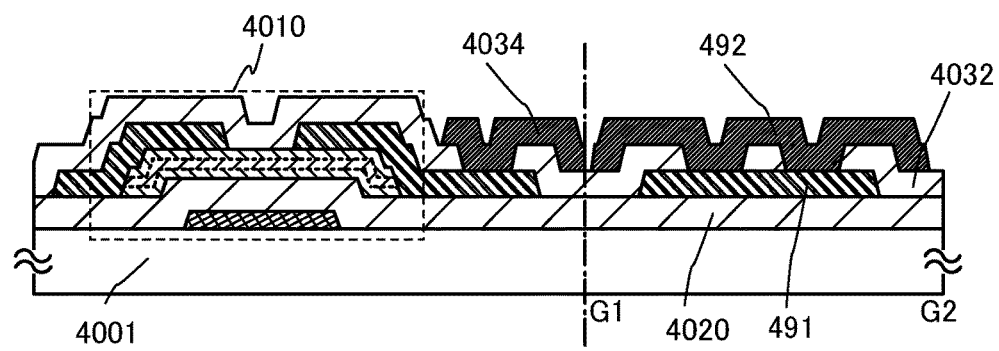
FIGS. 11A to 11C illustrate one embodiment of a semiconductor device.
Figure 11B:
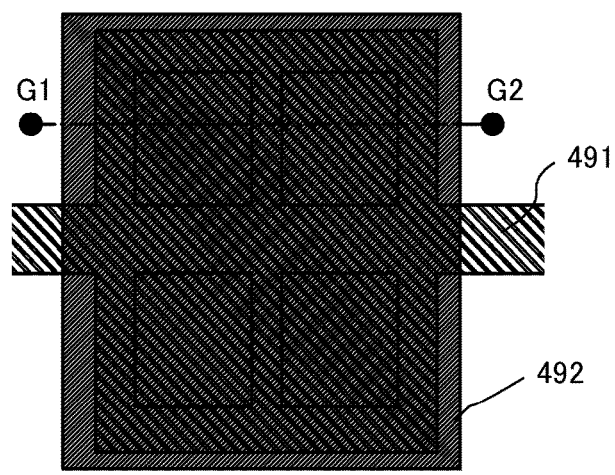
Figure 11C:
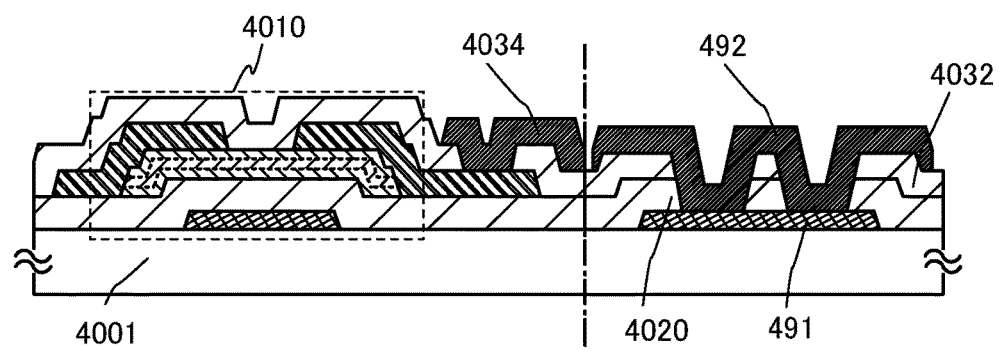

FIGS. 11A to 11C illustrate examples in which a common connection portion (pad portion) for electrically connection with the second electrode layer 4031 provided on the substrate 4006 in the display device in FIG. 5 is formed over the substrate 4001.

The common connection portion is provided in a position that overlaps with a sealant for bonding the substrate 4001 and the substrate 4006, and is electrically connected to the second electrode layer 4031 via conductive particles contained in the sealant. Alternatively, the common connection portion is provided in a position that does not overlap with the sealant (except for the pixel portion) and a paste containing conductive particles is provided separately from the sealant so as to overlap with the common connection portion, whereby the common connection portion is electrically connected to the second electrode layer 4031.

FIG. 11A is a cross-sectional view of the common connection portion and corresponds to a cross section along G1-G2 in the top view in FIG. 11B.

A common potential line 491 is provided over a gate insulating layer 4020, and is formed using a material and a process similar to those of the source and drain electrodes of the transistors 4010 and 4011 illustrated in FIG. 5.

Further, the common potential line 491 is covered with the insulating layer 4032, and the insulating layer 4032 includes a plurality of opening portions overlapping with the common potential line 491. The opening portions are formed in the same process as a contact hole for connecting one of the source and drain electrodes of the transistor 4010 and the first electrode layer 4034.

A common electrode 492 is provided over the insulating layer 4032 and formed using a material and a process similar to those of the connection terminal electrode 4015 and the first electrode layer 4034 of the pixel portion.

In this manner, the common connection portion can be formed by utilizing the process for manufacturing the switching element of the pixel portion 4002.

Note that the common electrode 492 is an electrode in contact with the conductive particles contained in the sealant, and is electrically connected to the second electrode layer 4031 of the substrate 4006.

As illustrated in FIG. 11C, the common potential line 491 may be formed using a material and a process similar to those of the gate electrodes of the transistors 4010 and 4011.

In the common connection portion illustrated in FIG. 11C, the common potential line 491 is provided below the gate insulating layer 4020 and the insulating layer 4032, and the gate insulating layer 4020 and the insulating layer 4032 have a plurality of opening portions overlapping with the common potential line 491. The opening portions are formed in such a manner that the insulating layer 4032 is etched in the same process as the contact hole for connecting one of the source and drain electrode layers of the transistor 4010 and the first electrode layer 4034, and then the gate insulating layer 4020 is selectively etched.

Alternatively, as the display element included in the display device, a light-emitting element utilizing electroluminescence can be used. Light-emitting elements utilizing electroluminescence are classified according to whether a light-emitting material is an organic compound or an inorganic compound. In general, the former is referred to as an organic EL element, and the latter is referred to as an inorganic EL element.

In an organic EL element, by application of voltage to a light-emitting element, electrons and holes are separately injected from a pair of electrodes into a layer containing a light-emitting organic compound, and current flows. The carriers (electrons and holes) are recombined, and thus, the light-emitting organic compound is excited. The light-emitting organic compound returns to a ground state from the excited state, thereby emitting light. Owing to such a mechanism, this light-emitting element is referred to as a current-excitation light-emitting element. In this embodiment, an organic EL element is used as a light-emitting element.

The inorganic EL elements are classified according to their element structures into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localized type light emission that utilizes inner-shell electron transition of metal ions. Note that an example of an organic EL element as a light-emitting element is described here.

In order to extract light emitted from the light-emitting element, at least one of the pair of electrodes has a light-transmitting property. The light-emitting element can have a top emission structure in which light emission is extracted through the surface opposite to the substrate; a bottom emission structure in which light emission is extracted through the surface on the substrate side; or a dual emission structure in which light emission is extracted through the surface opposite to the substrate and the surface on the substrate side, and a light-emitting element having any of these emission structures can be used.

Figure 6A:
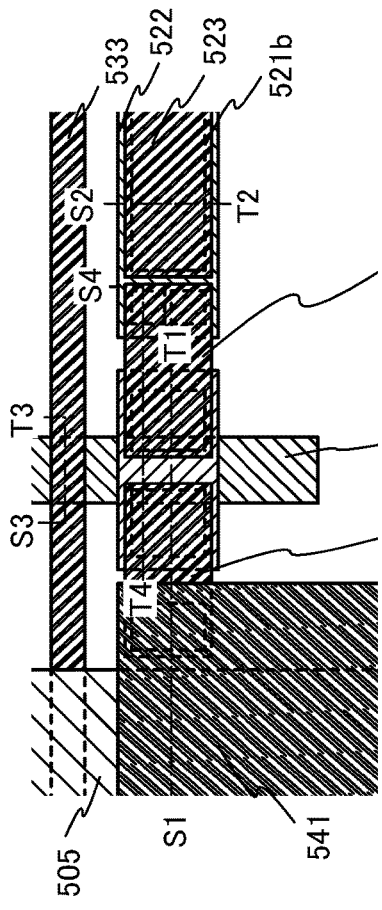
FIGS. 6A and 6B illustrate one embodiment of a semiconductor device.
Figure 6B:
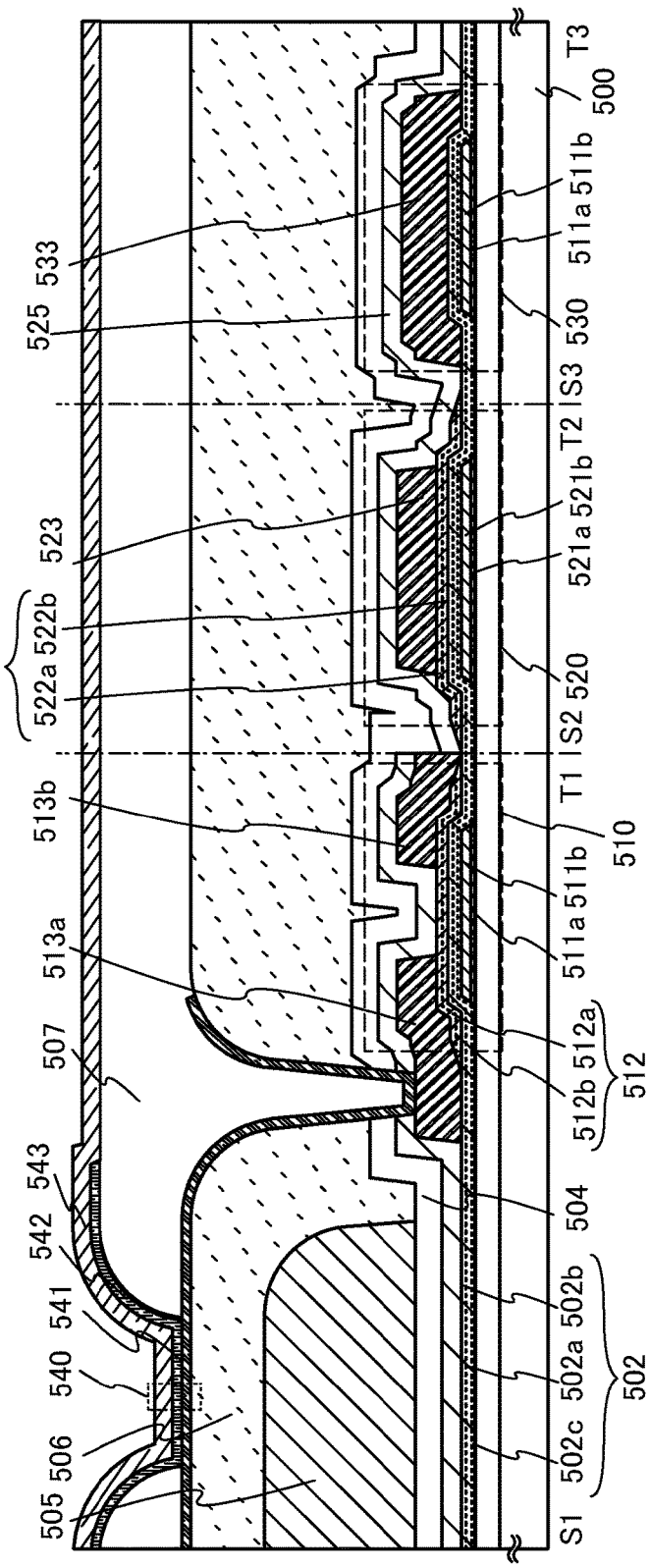
Figure 13:
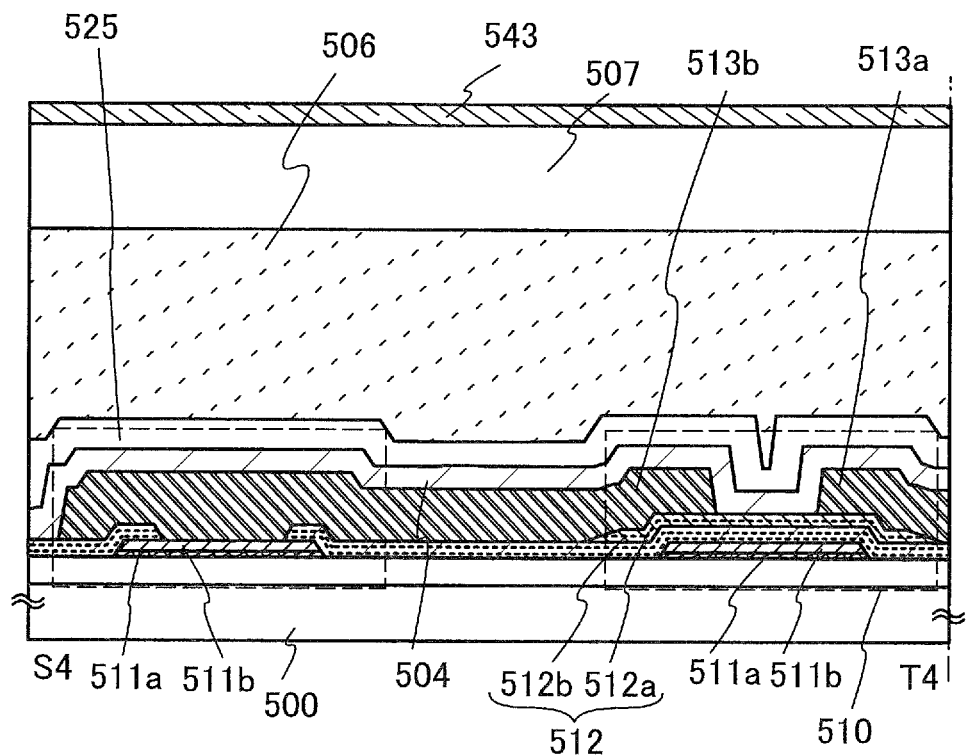
FIG. 13 illustrates one embodiment of a semiconductor device.

FIGS. 6A and 6B and FIG. 13 illustrate an example of a light-emitting device including the light-emitting element as a display element.

FIG. 6A is a plan view of the light-emitting device, and FIG. 6B is a cross-sectional view taken along dashed-dotted lines S1-T1, S2-T2, and S3-T3 in FIG. 6A. FIG. 13 is a cross-sectional view taken along a dashed-dotted S4-T4 in FIG. 6A. Note that, an electroluminescent layer 542 and a second electrode layer 543 are not illustrated in the plan view in FIG. 6A.

The light-emitting device illustrated in FIGS. 6A and 6B includes, over a substrate 500, a transistor 510, a capacitor 520, and a wiring layer intersection 530. The transistor 510 is electrically connected to a light-emitting element 540. Note that FIGS. 6A and 6B illustrate a bottom-emission light-emitting device in which light from the light-emitting element 540 is extracted through the substrate 500.

The transistor described in Embodiment 1 or 2 can be applied to the transistor 510. In this embodiment, an example in which a transistor having a structure similar to that of the transistor 330 described in Embodiment 2 is used is described. The transistor 510 is a bottom-gate transistor.

The transistor 510 includes gate electrode layers 511a and 511b; a gate insulating layer 502 including gate insulating layers 502a, 502b, and 502c; an oxide semiconductor layer 512 including oxide semiconductor layers 512b and 512a; and conductive layers 513a and 513b serving as a source electrode layer and a drain electrode layer. Further, an insulating layer 525 is formed over the transistor 510.

The capacitor 520 includes conductive layers 521a and 521b, the gate insulating layer 502, an oxide semiconductor stack 522 including oxide semiconductor layers 522b and 522a, and a conductive layer 523. The gate insulating layer 502 and the oxide semiconductor stack 522 are sandwiched between the conductive layer 523 and the conductive layers 521a and 521b, whereby the capacitor is formed.

The wiring layer intersection 530 is an intersection of a conductive layer 533 and the gate electrode layers 511a and 511b. The conductive layer 533 and the gate electrode layers 511a and 511b intersect with each other with the gate insulating layer 502 provided therebetween.

In this embodiment, a 30-nm-thick titanium film is used as each of the gate electrode layer 511a and the conductive layer 521a, and a 200-nm-thick copper thin film is used as each of the gate electrode layer 511b and the conductive layer 521b. Thus, the gate electrode layer has a stacked-layer structure of the titanium film and the copper thin film.

The transistor 510 includes the oxide semiconductor layer 512b functioning as a channel, and the oxide semiconductor layer 512a functioning as a buffer layer for preventing diffusion of a constituent element of the conductive layers 513a and 513b into the channel. Accordingly, the transistor 510 is a highly reliable transistor in which influence of an interface state which can be formed on the back channel side is reduced.

Further, in the transistor 510, a nitrogen-containing silicon film which functions as a barrier film against copper and whose ammonia content is reduced is included as the gate insulating layer 502c, a nitrogen-containing silicon film having a large thickness (e.g., 300 nm) in which the number of defects is reduced is included as the gate insulating layer 502a, and a nitrogen-containing silicon film in which the hydrogen concentration is reduced is included as the gate insulating layer 502b. With such a structure, the transistor 510 can have favorable electrical characteristics and electrostatic breakdown of the transistor 510 can be prevented. Accordingly, a highly reliable semiconductor device can be provided in a high yield.

An interlayer insulating layer 504 is formed over the transistor 510, the capacitor 520, and the wiring layer intersection 530. Over the interlayer insulating layer 504, a color filter layer 505 is provided in a region overlapping with the light-emitting element 540. An insulating layer 506 functioning as a planarization insulating layer is provided over the interlayer insulating layer 504 and the color filter layer 505.

The light-emitting element 540 having a stacked-layer structure in which a first electrode layer 541, the electroluminescent layer 542, and the second electrode layer 543 are stacked in this order is provided over the insulating layer 506. The first electrode layer 541 and the conductive layer 513a are in contact with each other in an opening formed in the insulating layer 506 and the interlayer insulating layer 504, which reaches the conductive layer 513a; thus the light-emitting element 540 and the transistor 510 are electrically connected to each other. Note that a partition 507 is provided so as to cover part of the first electrode layer 541 and the opening.

Further, a 1500-nm-thick photosensitive acrylic film and a 1500-nm-thick photosensitive polyimide film can be used as the insulating layer 506 and the partition 507, respectively.

As the color filter layer 505, for example, a chromatic light-transmitting resin can be used. As the chromatic color light-transmitting resin, a photosensitive organic resin or a non-photosensitive organic resin can be used. The photosensitive organic resin is preferably used, in which case the number of resist masks can be reduced, which results in the simplification of the process.

Chromatic colors are all colors except achromatic colors such as black, gray, and white. The color filter layer is formed using a material which transmits only light of the chromatic colors. As chromatic color, red, green, blue, or the like can be used. Alternatively, cyan, magenta, yellow, or the like may also be used. "Transmitting only light of a chromatic color" means that light passing through the color filter layer has a peak at a wavelength of the light of the chromatic color. The thickness of the color filter layer may be controlled as appropriate in consideration of the relationship between the concentration of the coloring material to be included and the transmittance of light. For example, the color filter layer 505 may have a thickness greater than or equal to 1500 nm and less than or equal to 2000 nm.

The partition 507 can be formed using an organic insulating material or an inorganic insulating material. It is particularly preferable that the partition 507 be formed using a photosensitive resin material to have an opening over the first electrode layer 541. A sidewall of the opening is preferably formed as a tilted surface with continuous curvature.

The electroluminescent layer 542 may be formed using either a single layer or a stack of a plurality of layers.

A protective film may be formed over the second electrode layer 543 and the partition 507 in order to prevent entry of oxygen, hydrogen, moisture, carbon dioxide, or the like into the light-emitting element 540. As the protective film, a silicon nitride film, a silicon nitride oxide film, a DLC film, or the like can be formed.

Further, the light-emitting element 540 may be covered with a layer containing an organic compound deposited by an evaporation method so that oxygen, hydrogen, moisture, carbon dioxide, or the like do not enter the light-emitting element 540.

In addition, if needed, an optical film, such as a polarizing plate, a circularly polarizing plate (including an elliptically polarizing plate), a retardation plate (a quarter-wave plate or a half-wave plate), or a color filter, may be provided as appropriate on a light-emitting surface of the light-emitting element. Further, the polarizing plate or the circularly polarizing plate may be provided with an anti-reflection film. For example, anti-glare treatment by which reflected light can be diffused by projections and depressions on the surface so as to reduce the glare can be performed.

Further, an electronic paper in which electronic ink is driven can be provided as the display device. The electronic paper is also called an electrophoretic display device (electrophoretic display) and has advantages in that it has the same level of readability as regular paper, it has less power consumption than other display devices, and it can be set to have a thin and light form.

An electrophoretic display device can have various modes. An electrophoretic display device includes a plurality of microcapsules dispersed in a solvent, and each microcapsule contains first particles which are positively charged and second particles which are negatively charged. By applying an electric field to the microcapsules, the particles in the microcapsules move in opposite directions to each other and only the color of the particles gathering on one side is displayed. Note that the first particles and the second particles each contain pigment and do not move without an electric field. Moreover, the first particles and the second particles have different colors (which may be colorless).

A dispersion of the above microcapsules in a solvent is referred to as electronic ink. Furthermore, by the use of a color filter or particles that have a pigment, color display is also possible.

The insulating layer 506 functioning as a planarization insulating layer can be formed using an organic material having heat resistance, such as an acrylic resin, polyimide, a benzocyclobutene-based resin, polyamide, or an epoxy resin. Other than such organic materials, it is also possible to use a low-dielectric constant material (low-k material) such as a siloxane-based resin, phosphosilicate glass (PSG), or borophosphosilicate glass (BPSG). Note that the insulating layer 506 may be formed by stacking a plurality of insulating layers formed using any of these materials.

There is no particular limitation on the method of forming the insulating layer 506; the following method can be used depending on the material: a sputtering method, spin coating, dipping, spray coating, a droplet discharge method (an inkjet method), screen printing, offset printing, or the like.

Materials similar to those of the first electrode layer 4034 and the second electrode layer 4031 illustrated in FIG. 5 can be used for the first electrode layer 541 and the second electrode layer 543.

In this embodiment, since the light-emitting device illustrated in FIGS. 6A and 6B has a bottom-emission structure, the first electrode layer 541 has a light-transmitting property and the second electrode layer 543 has a light-reflecting property. Accordingly, in the case of using a metal film as the first electrode layer 541, the film is preferably thin enough to keep the light-transmitting property; on the other hand, in the case of using a light-transmitting conductive film as the second electrode layer 543, a conductive layer having a light-reflecting property is preferably stacked thereon.

A protective circuit for protecting the driver circuit may be provided. The protection circuit is preferably formed using a nonlinear element.

By using the transistor described in Embodiment 1 or 2 as described above, the semiconductor device can have a variety of functions.

The structures, methods, and the like described in this embodiment can be combined as appropriate with any of the other structures, methods, and the like described in the other embodiments.

Embodiment 4

A semiconductor device having an image sensor function of reading data on an object can be manufactured using the transistors described in Embodiment 1 or 2.

Figure 7A:
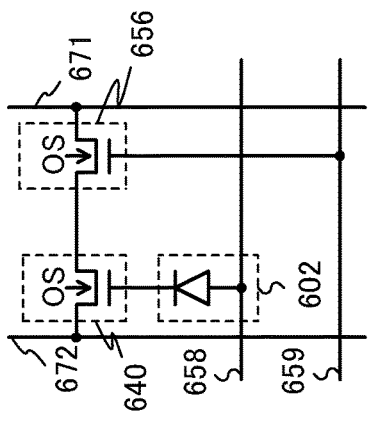
FIGS. 7A and 7B illustrate one embodiment of a semiconductor device.

An example of a semiconductor device having an image sensor function is illustrated in FIG. 7A. FIG. 7A illustrates an equivalent circuit of a photo sensor, and FIG. 7B is a cross-sectional view illustrating part of the photo sensor.

In a photodiode 602, one electrode is electrically connected to a photodiode reset signal line 658, and the other electrode is electrically connected to a gate of a transistor 640. One of a source and a drain of the transistor 640 is electrically connected to a photo sensor reference signal line 672, and the other of the source and the drain thereof is electrically connected to one of a source and a drain of a transistor 656. A gate of the transistor 656 is electrically connected to a gate signal line 659, and the other of the source and the drain thereof is electrically connected to a photo sensor output signal line 671.

Note that in circuit diagrams in this specification, a transistor using an oxide semiconductor layer is denoted by a symbol "OS" so that it can be identified as a transistor including an oxide semiconductor layer. In FIG. 7A, the transistor 640 and the transistor 656 are each a transistor using an oxide semiconductor layer, to which the transistor described in Embodiment 1 or 2 can be applied. This embodiment shows an example of using a transistor having a structure similar to that of the transistor 320 described in Embodiment 1. The transistor 640 is a bottom-gate transistor.

Figure 7B:
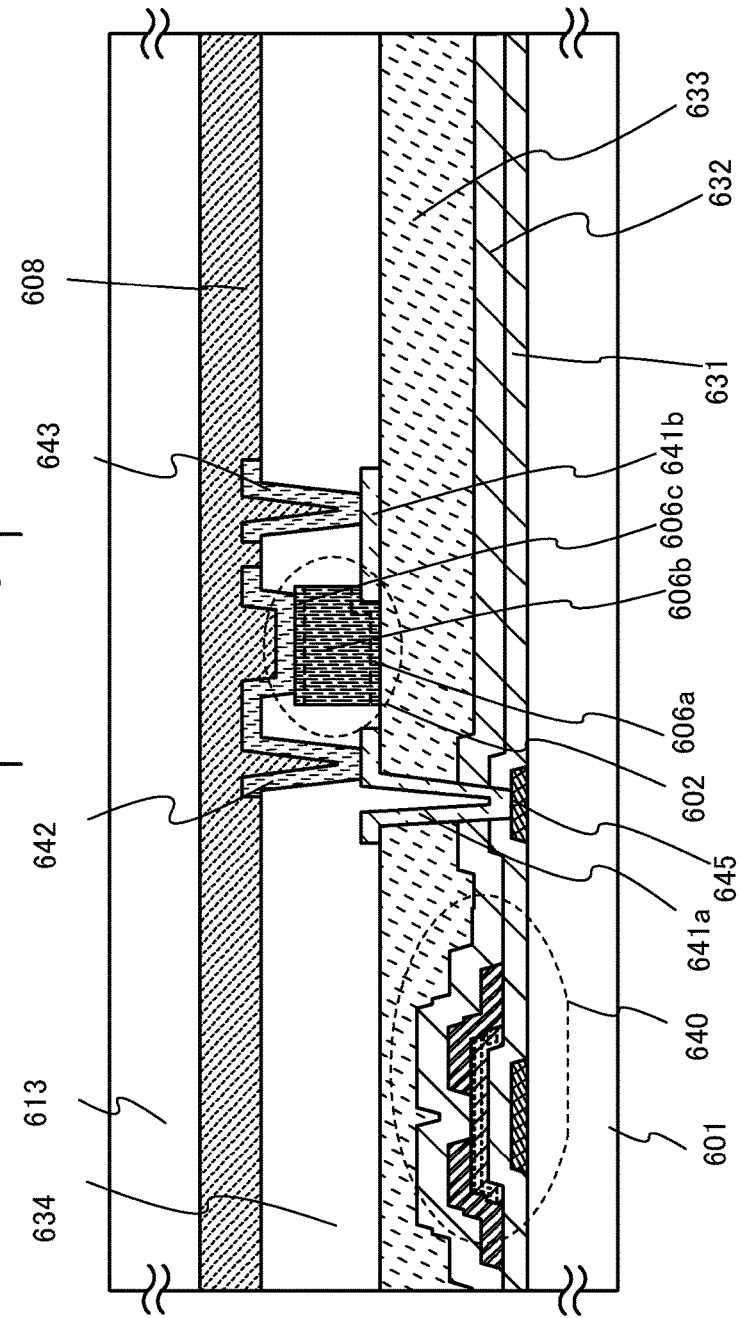

FIG. 7B is a cross-sectional view of the photodiode 602 and the transistor 640 in the photosensor. The transistor 640 and the photodiode 602 functioning as a sensor are provided over a substrate 601 (an element substrate) having an insulating surface. A substrate 613 is provided over the photodiode 602 and the transistor 640 with an adhesive layer 608 interposed therebetween.

An insulating layer 632, an interlayer insulating layer 633, and an interlayer insulating layer 634 are provided over the transistor 640. The photodiode 602 includes an electrode layer 641b formed over the interlayer insulating layer 633, semiconductor films (a first semiconductor film 606a, a second semiconductor film 606b, and a third semiconductor film 606c stacked over the electrode layer 641b in this order), an electrode layer 642 which is provided over the interlayer insulating layer 634 and electrically connected to the electrode layer 641b through the first to third semiconductor films, and an electrode layer 641a which is provided in the same layer as the electrode layer 641b and electrically connected to the electrode layer 642.

The electrode layer 641b is electrically connected to a conductive layer 643 formed over the interlayer insulating layer 634, and the electrode layer 642 is electrically connected to a conductive layer 645 through the electrode layer 641a. The conductive layer 645 is electrically connected to a gate electrode layer of the transistor 640, and the photodiode 602 is electrically connected to the transistor 640.

Here, a pin photodiode in which a semiconductor film having p-type conductivity as the first semiconductor film 606a, a high-resistance semiconductor film (i-type semiconductor film) as the second semiconductor film 606b, and a semiconductor film having n-type conductivity as the third semiconductor film 606c are stacked is illustrated as an example.

The first semiconductor film 606a is a p-type semiconductor film and can be formed using an amorphous silicon film containing an impurity element imparting p-type conductivity type. The first semiconductor film 606a is formed by a plasma CVD method using a semiconductor source gas containing an impurity element belonging to Group 13 (e.g., boron (B)). As the semiconductor material gas, silane ($SiH_4$) may be used. Alternatively, $Si_2H_6$, $SiH_2Cl_2$, $SiHCl_3$, $SiCl_4$, $SiF_4$, or the like may be used. Further alternatively, an amorphous silicon film which does not contain an impurity element may be formed, and then, an impurity element may be introduced to the amorphous silicon film using a diffusion method or an ion injecting method. Heating or the like may be conducted after introducing the impurity element by an ion injecting method or the like in order to diffuse the impurity element. In this case, as a method of forming the amorphous silicon film, an LPCVD method, a chemical vapor deposition method, a sputtering method, or the like may be used. The first semiconductor film 606a is preferably formed to have a thickness greater than or equal to 10 nm and less than or equal to 50 nm.

The second semiconductor film 606b is an i-type semiconductor film (intrinsic semiconductor film) and is formed using an amorphous silicon film. As for formation of the second semiconductor film 606b, an amorphous silicon film is formed by a plasma CVD method using a semiconductor source gas. As the semiconductor material gas, silane ($SiH_4$) may be used. Alternatively, $Si_2H_6$, $SiH_2Cl_2$, $SiHCl_3$, $SiCl_4$, $SiF_4$, or the like may be used. The second semiconductor film 606b may be formed by an LPCVD method, a vapor deposition method, a sputtering method, or the like. The second semiconductor film 606b is preferably formed to have a thickness greater than or equal to 200 nm and less than or equal to 1000 nm.

The third semiconductor film 606c is an n-type semiconductor film and is formed using an amorphous silicon film containing an impurity element imparting n-type conductivity type. The third semiconductor film 606c is formed by a plasma CVD method using a semiconductor source gas containing an impurity element belonging to Group 15 (e.g., phosphorus (P)). As the semiconductor material gas, silane (SiH$_4$) may be used. Alternatively, Si$_2$H$_6$, SiH$_2$Cl$_2$, SiHCl$_3$, SiCl$_4$, SiF$_4$, or the like may be used. Further alternatively, an amorphous silicon film which does not contain an impurity element may be formed, and then, an impurity element may be introduced to the amorphous silicon film with use of a diffusion method or an ion injecting method. Heating or the like may be conducted after introducing the impurity element by an ion injecting method or the like in order to diffuse the impurity element. In this case, as a method of forming the amorphous silicon film, an LPCVD method, a chemical vapor deposition method, a sputtering method, or the like may be used. The third semiconductor film 606*c* is preferably formed to have a thickness greater than or equal to 20 nm and less than or equal to 200 nm.

The first semiconductor film 606*a*, the second semiconductor film 606*b*, and the third semiconductor film 606*c* are not necessarily formed using an amorphous semiconductor, and may be formed using a polycrystalline semiconductor or a microcrystalline semiconductor (semi-amorphous semiconductor: SAS).

The mobility of holes generated by the photoelectric effect is lower than the mobility of electrons. Therefore, a PIN photodiode has better characteristics when a surface on the p-type semiconductor film side is used as a light-receiving plane. Here, an example in which light received by the photodiode 602 from a surface of the substrate 601, over which the pin photodiode is formed, is converted into electric signals is described. Further, light from the semiconductor film having the conductivity type opposite to that of the semiconductor film on the light-receiving plane is disturbance light; therefore, the electrode layer is preferably formed using a light-blocking conductive layer. Note that the n-type semiconductor film side may alternatively be a light-receiving plane.

The transistor 640 includes a first oxide semiconductor layer which functions as a buffer layer for preventing diffusion of a constituent element of the source and drain electrode layers into a channel, a second oxide semiconductor layer which functions as the channel, and a third oxide semiconductor layer which is provided between a gate insulating layer 631 and the oxide semiconductor layer functioning as the channel and functions as a buffer layer for preventing degradation of the interface on the gate insulating layer 631 side of the channel. Accordingly, the transistor 640 is a highly reliable transistor in which influence of an interface state which can be formed on the back channel side is reduced and photodegradation (e.g., negative-bias temperature stress photodegradation) is reduced.

The insulating layer 632, the interlayer insulating layer 633, and the interlayer insulating layer 634 can be formed using an insulating material by a sputtering method, a plasma CVD method, spin coating, dipping, spray coating, a droplet discharge method (such as an inkjet method), a printing method (such as screen printing or offset printing), or the like depending on the material.

For reduction of surface roughness, an insulating layer functioning as a planarization insulating layer is preferably used as each of the interlayer insulating layers 633 and 634. For the interlayer insulating layers 633 and 634, for example, an organic insulating material having heat resistance, such as polyimide, an acrylic resin, a benzocyclobutene-based resin, polyamide, or epoxy, can be used. Other than such organic insulating materials, it is possible to use a single layer or stacked layers of a low-dielectric constant material (a low-k material), a siloxane-based resin, phosphosilicate glass (PSG), borophosphosilicate glass (BPSG), or the like.

With detection of light that enters the photodiode 602, data on an object can be read. Note that a light source such as a backlight can be used at the time of reading information on an object.

The structures, methods, and the like described in this embodiment can be combined as appropriate with any of the other structures, methods, and the like described in the other embodiments.

Embodiment 5

A semiconductor device disclosed in this specification can be applied to a variety of electronic appliances (including game machines). Examples of electronic appliances include a television set (also referred to as a television or a television receiver), a monitor of a computer or the like, cameras such as a digital camera and a digital video camera, a digital photo frame, a mobile phone, a portable game machine, a portable information terminal, an audio reproducing device, a game machine (e.g., a pachinko machine or a slot machine), a game console, and the like. Specific examples of these electronic appliances are illustrated in FIGS. 8A to 8C.

Figure 8A:
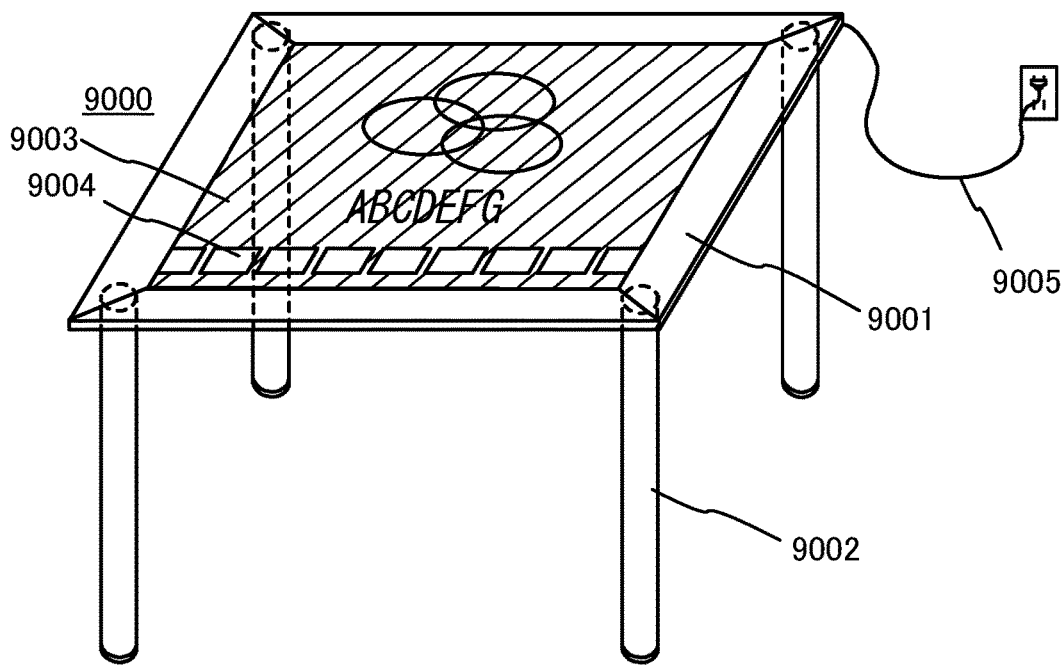
FIGS. 8A to 8C illustrate electronic appliances.
Figure 8B:
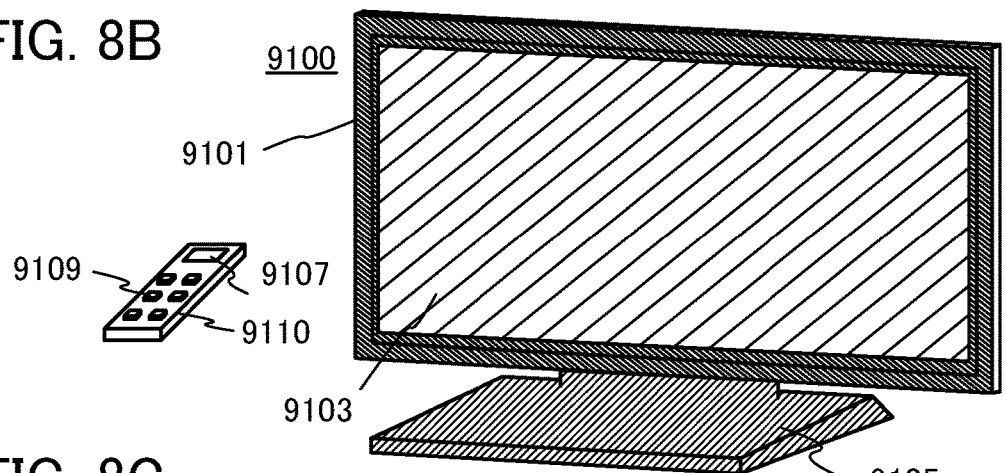
Figure 8C:
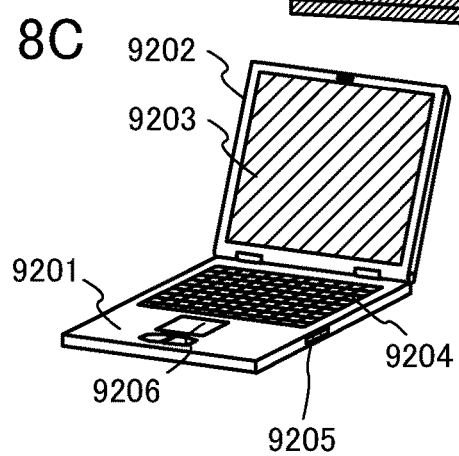

FIG. 8A illustrates a table 9000 having a display portion. In the table 9000, a display portion 9003 is incorporated in a housing 9001 and an image can be displayed on the display portion 9003. Note that the housing 9001 is supported by four leg portions 9002. Further, a power cord 9005 for supplying power is provided for the housing 9001.

The semiconductor device described in any of the above embodiments can be used in the display portion 9003, so that the electronic appliance can have high reliability.

The display portion 9003 has a touch-input function. When a user touches displayed buttons 9004 which are displayed on the display portion 9003 of the table 9000 with his/her finger or the like, the user can carry out operation of the screen and input of information. Further, when the table may be made to communicate with home appliances or control the home appliances, the table 9000 may function as a control device which controls the home appliances by operation on the screen. For example, with use of the semiconductor device having an image sensor described in Embodiment 3, the display portion 9003 can function as a touch panel.

Further, the screen of the display portion 9003 can be placed perpendicular to a floor with a hinge provided for the housing 9001; thus, the table 9000 can also be used as a television device. When a television device having a large screen is set in a small room, an open space is reduced; however, when a display portion is incorporated in a table, a space in the room can be efficiently used.

FIG. 8B illustrates a television set 9100. In the television set 9100, a display portion 9103 is incorporated in a housing 9101 and an image can be displayed on the display portion 9103. Note that the housing 9101 is supported by a stand 9105 here.

The television set 9100 can be operated with an operation switch of the housing 9101 or a separate remote controller 9110. Channels and volume can be controlled with an operation key 9109 of the remote controller 9110 so that an image displayed on the display portion 9103 can be controlled. Furthermore, the remote controller 9110 may be provided with a display portion 9107 for displaying data output from the remote controller 9110.

The television set 9100 illustrated in FIG. 8B is provided with a receiver, a modem, and the like. With the use of the receiver, the television set 9100 can receive general TV broadcasts. Moreover, when the television set 9100 is connected to a communication network with or without wires via the modem, one-way (from a sender to a receiver) or two-way (between a sender and a receiver or between receivers) information communication can be performed.

The semiconductor device described in any of the above embodiments can be used in the display portions 9103 and 9107, so that the television set and the remote controller can have high reliability.

FIG. 8C illustrates a computer which includes a main body 9201, a housing 9202, a display portion 9203, a keyboard 9204, an external connection port 9205, a pointing device 9206, and the like.

The semiconductor device described in any of the above embodiments can be used in the display portion 9203, so that the computer can have high reliability.

Figure 9A:
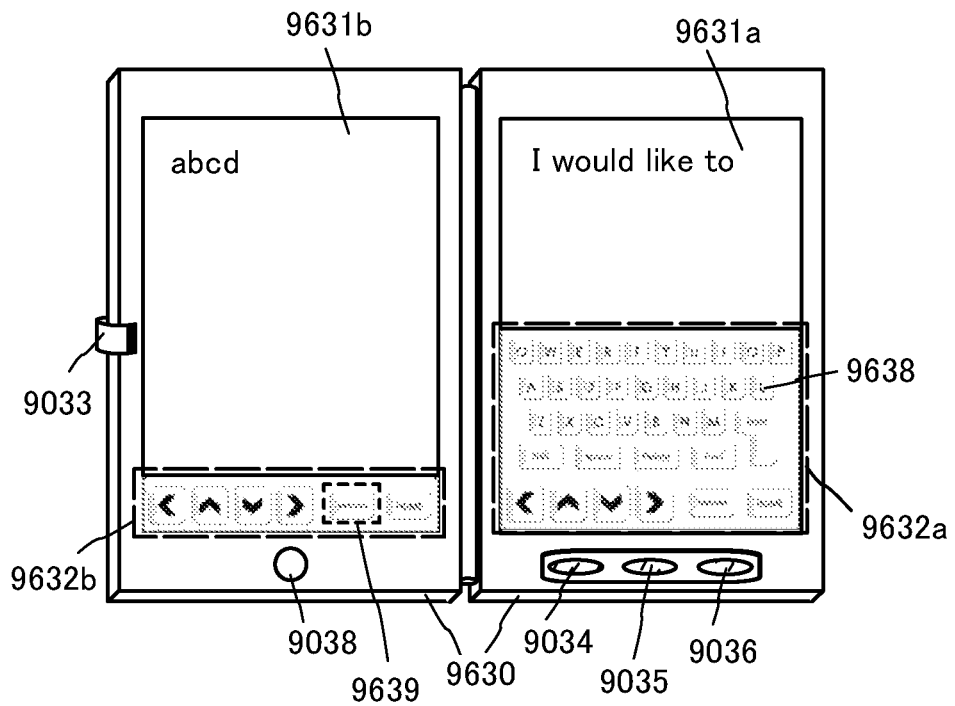
FIGS. 9A to 9C illustrate an electronic appliance.
Figure 9B:
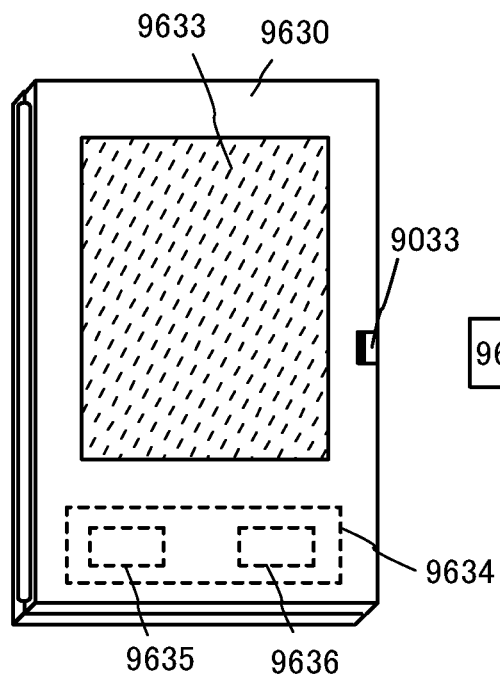

FIGS. 9A and 9B illustrate a tablet terminal that can be folded. In FIG. 9A, the tablet terminal is opened, and includes a housing 9630, a display portion 9631a, a display portion 9631b, a switch 9034 for switching display modes, a power switch 9035, a switch 9036 for switching to power-saving mode, a clip 9033, and an operation switch 9038.

The semiconductor device described in any of the above embodiments can be used in the display portion 9631a and the display portion 9631b, so that the tablet terminal can have high reliability.

Part of the display portion 9631a can be a touch panel region 9632a, and data can be input by touching operation keys 9638 that are displayed. Note that FIG. 9A shows, as an example, that half of the area of the display portion 9631a has only a display function and the other half of the area has a touch panel function. However, the structure of the display portion 9631a is not limited to this, and all the area of the display portion 9631a may have a touch panel function. For example, all the area of the display portion 9631a can display keyboard buttons and serve as a touch panel while the display portion 9631b can be used as a display screen.

Like the display portion 9631a, part of the display portion 9631b can be a touch panel region 9632b. When a finger, a stylus, or the like touches the place where a button 9639 for switching to keyboard display is displayed in the touch panel, keyboard buttons can be displayed on the display portion 9631b.

Touch input can be performed concurrently on the touch panel regions 9632a and 9632b.

The switch 9034 for switching display modes allows switching between a landscape mode and a portrait mode, color display and black-and-white display, and the like. With the switch 9036 for switching to power-saving mode, the luminance of display can be optimized in accordance with the amount of external light at the time when the tablet terminal is in use, which is detected with an optical sensor incorporated in the tablet terminal. The tablet terminal may include another detection device such as a sensor for detecting orientation (e.g., a gyroscope or an acceleration sensor) in addition to the optical sensor.

Although the display portion 9631a and the display portion 9631b have the same display area in FIG. 9A, an embodiment of the present invention is not limited to this example. The display portion 9631a and the display portion 9631b may have different areas or different display quality. For example, one of them may be a display panel that can display higher-definition images than the other.

FIG. 9B illustrates the tablet terminal folded, which includes the housing 9630, a solar battery 9633, and a charge and discharge control circuit 9634. Note that FIG. 9B shows an example in which the charge and discharge control circuit 9634 includes the battery 9635 and the DCDC converter 9636.

Since the tablet can be folded in two, the housing 9630 can be closed when the tablet is not in use. Thus, the display portions 9631a and 9631b can be protected, thereby providing a tablet with high endurance and high reliability for long-term use.

The tablet terminal illustrated in FIGS. 9A and 9B can have other functions such as a function of displaying various kinds of data (e.g., a still image, a moving image, and a text image), a function of displaying a calendar, a date, the time, or the like on the display portion, a touch-input function of operating or editing the data displayed on the display portion by touch input, and a function of controlling processing by various kinds of software (programs).

The solar battery 9633, which is attached on the surface of the tablet terminal, supplies electric power to a touch panel, a display portion, an image signal processor, and the like. Note that the solar battery 9633 can be provided on one or both surfaces of the housing 9630 and the battery 9635 can be charged efficiently. When a lithium ion battery is used as the battery 9635, there is an advantage of downsizing or the like.

Figure 9C:
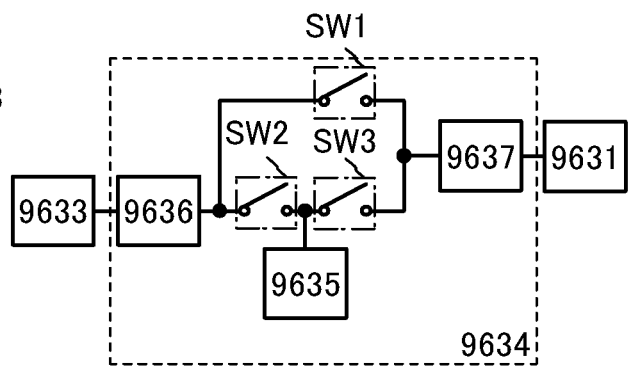

The structure and operation of the charge and discharge control circuit 9634 illustrated in FIG. 9B are described with reference to a block diagram of FIG. 9C. FIG. 9C illustrates the solar battery 9633, the battery 9635, the DCDC converter 9636, a converter 9637, switches SW1 to SW3, and the display portion 9631. The battery 9635, the DCDC converter 9636, the converter 9637, and the switches SW1 to SW3 correspond to the charge and discharge control circuit 9634 in FIG. 9B.

First, an example of operation in the case where power is generated by the solar battery 9633 using external light is described. The voltage of power generated by the solar battery 9633 is raised or lowered by the DCDC converter 9636 so that a voltage for charging the battery 9635 is obtained. When the display portion 9631 is operated with the power from the solar battery 9633, the switch SW1 is turned on and the voltage of the power is raised or lowered by the converter 9637 to a voltage needed for operating the display portion 9631. In addition, when display on the display portion 9631 is not performed, the switch SW1 is turned off and a switch SW2 is turned on so that charge of the battery 9635 may be performed.

Here, the solar battery 9633 is shown as an example of a power generation means; however, there is no particular limitation on a way of charging the battery 9635, and the battery 9635 may be charged with another power generation means such as a piezoelectric element or a thermoelectric conversion element (Peltier element). For example, the battery 9635 may be charged with a non-contact power transmission module that transmits and receives power wirelessly (without contact) to charge the battery or with a combination of other charging means.

The structures, methods, and the like described in this embodiment can be combined as appropriate with any of the structures, methods, and the like described in the other embodiments.

EXAMPLE

In this example, measurement results of the concentrations of a constituent element of a source electrode layer or a drain electrode layer which is contained in stacked oxide semiconductor layers in a transistor are described. Specifically, an electrode layer including a copper film was formed for a source electrode layer and a drain electrode layer and the copper concentration in each oxide semiconductor layer was measured. For the measurement of the copper concentration, substrate side depth profile secondary ion mass spectrometry (SSDP-SIMS) was used.

A method for forming a transistor used in the measurement in this example is described below. In this example, a transistor having a structure similar to that of the transistor 300 in Embodiment 1 was formed. The same reference numerals as those of the transistor 300 are used in the following description.

First, a 100-nm-thick tungsten film was formed as the gate electrode layer 402 over the substrate 400.

Next, a 50-nm-thick silicon nitride film and a 200-nm-thick silicon oxynitride film were formed successively by a plasma CVD method as the gate insulating layer 404 covering the gate electrode layer 402.

The silicon nitride film was deposited in a condition where the pressure in a treatment chamber of a plasma CVD apparatus was set to 60 Pa, a power of 150 W was supplied at a high frequency power source of 27.12 MHz, the substrate temperature was set to 350° C., and a mixed gas of silane and nitrogen ($SiH_4:N_2$=50 sccm:5000 sccm) was supplied. Note that the plasma CVD apparatus is a parallel plate plasma CVD apparatus having an electrode area of 6000 $cm^2$. The silicon oxynitride film was deposited in the same treatment chamber in a condition where the pressure was set o 40 Pa, the high-frequency power source and the substrate temperature were maintained, and a mixed gas of silane and dinitrogen monoxide ($SiH_4:N_2O$=20 sccm:3000 sccm) was supplied.

Next, the oxide semiconductor layer 408$b$ with a thickness of 10 nm was formed over the gate insulating layer 404 by a sputtering method using a metal oxide target having an atomic ratio of In:Ga:Zn=1:1:1. The deposition conditions are as follows: the atmosphere contains oxygen at 50%, the pressure was 0.6 Pa, the electric power was 5 kW, and the substrate temperature was 170° C.

After that, the oxide semiconductor layer 408$a$ with a thickness of 30 nm was formed over the oxide semiconductor layer 408$b$ by a sputtering method using a metal oxide target having an atomic ratio of In:Ga:Zn=3:1:2. The deposition conditions are as follows: the atmosphere contains oxygen at 50%, the pressure was 0.6 Pa, the electric power was 5 kW, and the substrate temperature was 170° C.

Processing was performed so that the island-shaped oxide semiconductor stack 408 was obtained. Then, the oxide semiconductor stack 408 was subjected to heat treatment in a nitrogen atmosphere at 450° C. for one hour and then subjected to heat treatment in an atmosphere containing nitrogen and oxygen at 450° C. for one hour.

Next, the source electrode layer 410$a$ and the drain electrode layer 410$b$ which were in contact with the oxide semiconductor stack 408 were formed.

In this example, the source electrode layer 410$a$ and the drain electrode layer 410$b$ were formed in such a manner that a 35-nm-thick titanium film and a 200-nm-thick copper film were stacked over the gate insulating layer 404 and the oxide semiconductor stack 408 and part of the titanium film and part of the copper film were selectively etched.

After that, a 400-nm-thick silicon oxynitride film was deposited by a plasma CVD method as the insulating layer 412 covering the oxide semiconductor stack 408, the source electrode layer 410$a$, and the drain electrode layer 410$b$.

The silicon oxynitride film was deposited in a condition where the pressure of a treatment chamber of a plasma CVD apparatus was controlled to 200 Pa, a power of 1500 W was supplied at a high frequency power source of 27.12 MHz, the substrate temperature was set to 220° C., and a mixed gas of silane and dinitrogen monoxide ($SiH_4:N_2O$=160 sccm: 4000 sccm) was supplied.

Heat treatment was performed in an atmosphere containing nitrogen and oxygen at 300° C. for one hour, and then a 1.5-μm-thick acrylic resin film was formed as a planarization film. After that, heat treatment was performed in a nitrogen atmosphere at 250° C. for one hour.

Through the above process, the transistor of this example was formed.

Figure 12:
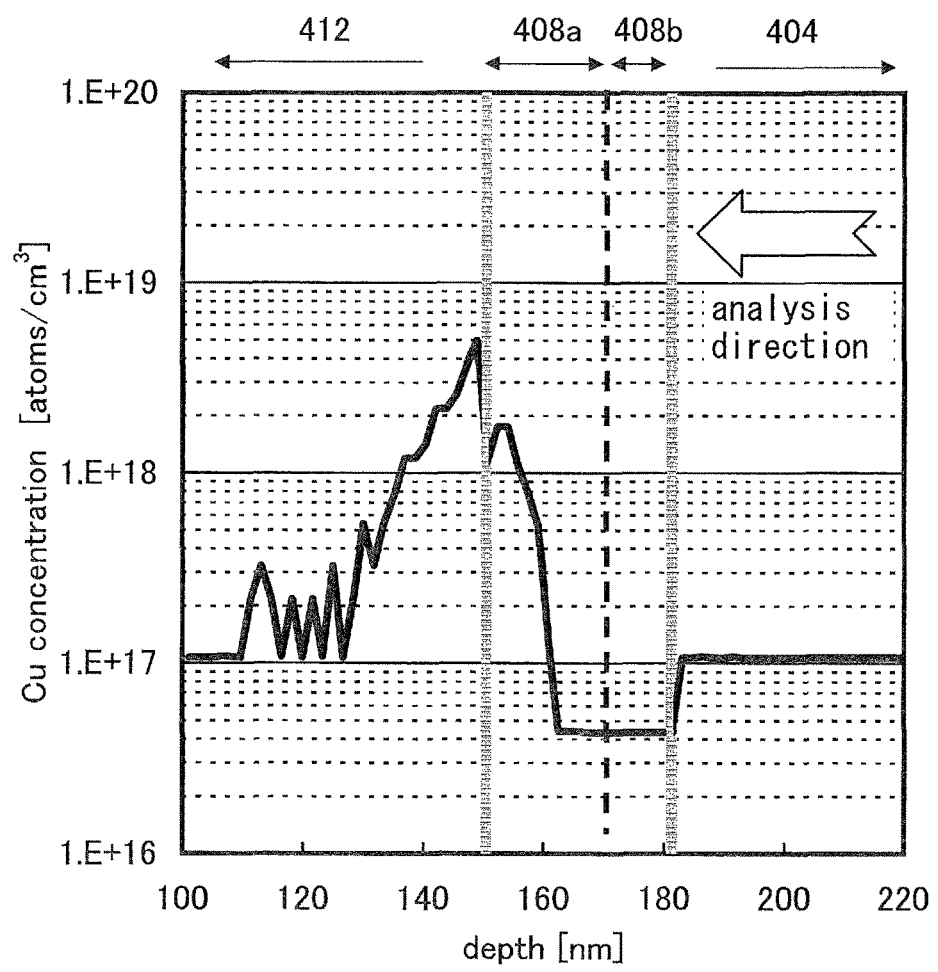
FIG. 12 shows measurement results of SSDP-SIMS in an example.

The copper concentration of the oxide semiconductor stack 408 included in the obtained transistor was measured by SSDP-SIMS. The measurement results by SSDP-SIMS are shown in FIG. 12. Note that the measurement was performed on a region between the source electrode layer 410$a$ and the drain electrode layer 410$b$ (a region where a channel is formed).

FIG. 12 shows that diffusion of copper which is a constituent element of the source electrode layer 410$a$ and the drain electrode layer 410$b$ into the oxide semiconductor stack 408 was observed but copper was not diffused beyond the oxide semiconductor layer 408$a$. Thus, it was confirmed that the copper does not reach the oxide semiconductor layer 408$b$, which functions as a current path (channel) of the transistor.

The above results show that, in the oxide semiconductor layer 408, the oxide semiconductor layer 408$a$ can function as a buffer layer for preventing diffusion of the constituent element of the source electrode layer 410$a$ and the drain electrode layer 410$b$ by being provided on the back channel side of the oxide semiconductor layer 408$b$ serving as a current path. Accordingly, it is suggested that variations in the electrical characteristics of the transistor including the oxide semiconductor stack 408 can be prevented.

REFERENCE NUMERALS

300: transistor; 310: transistor; 320: transistor; 330: transistor; 400: substrate; 402: gate electrode layer; 403: gate insulating layer; 403$a$: gate insulating layer; 403$b$: gate insulating layer; 403$c$: gate insulating layer; 404: gate insulating layer; 406: gate insulating layer; 408: oxide semiconductor stack; 408$a$: oxide semiconductor layer; 408$b$: oxide semiconductor layer; 408$c$: oxide semiconductor layer; 410$a$: source electrode layer; 410$b$: drain electrode layer; 412: insulating layer; 491: common potential line; 492: common electrode; 500: substrate; 502: gate insulating layer; 502$a$: gate insulating layer; 502$b$: gate insulating layer; 502$c$: gate insulating layer; 504: interlayer insulating layer; 505: color filter layer; 506: insulating layer; 507: partition; 510: transistor; 511$a$: gate electrode layer; 511$b$: gate electrode layer; 512: oxide semiconductor stack; 512$a$: oxide semiconductor layer; 512$b$: oxide semiconductor layer; 513$a$: conductive layer; 513$b$: conductive layer; 520: capacitor; 521$a$: conductive layer; 521$b$: conductive layer; 522: oxide semiconductor stack; 522$a$: oxide semiconductor layer; 522$b$: oxide semiconductor layer; 523: conductive layer; 525: insulating layer; 530: wiring layer intersection; 533: conductive layer; 540: light-emitting element; 541: electrode layer; 542: electroluminescent layer; 543: electrode layer; 601: substrate; 602: photodiode; 606$a$: semiconductor film; 606$b$: semiconductor film; 606$c$: semiconductor film; 608: adhesive layer; 613: substrate; 631: gate insulating layer; 632: insulating layer; 633: interlayer insulating layer; 634: interlayer insulating layer; 640: transistor; 641a: electrode layer; 641b: electrode layer; 642: electrode layer; 643: conductive layer; 645: conductive layer; 656: transistor; 658: photodiode reset signal line; 659: gate signal line; 671: photo sensor output signal line; 672: photo sensor reference signal line; 4001: substrate; 4002: pixel portion; 4003: signal line driver circuit; 4004: scan line driver circuit; 4005: sealant; 4006: substrate; 4008: liquid crystal layer; 4010: transistor; 4011: transistor; 4013: liquid crystal element; 4015: connection terminal electrode; 4016: terminal electrode; 4018: FPC; 4019: anisotropic conductive layer; 4020: gate insulating layer; 4031: electrode layer; 4032: insulating layer; 4033: insulating layer; 4034: electrode layer; 4035: spacer; 4038: insulating layer; 9000: table; 9001: housing; 9002: leg portion; 9003: display portion; 9004: displayed button; 9005: power cord; 9033: clip; 9034: switch; 9035: switch; 9036: switch; 9038: operation switch; 9100: television set; 9101: housing; 9103: display portion; 9105: stand; 9107: display portion; 9109: operation key; 9110: remote controller; 9201: main body; 9202: housing; 9203: display portion; 9204: keyboard; 9205: external connection port; 9206: pointing device; 9630: housing; 9631: display portion; 9631a: display portion; 9631b: display portion; 9632a: region; 9632b: region; 9633: solar battery; 9634: charge and discharge control circuit; 9635: battery; 9636: DCDC converter; 9637: converter; 9638: operation key; 9639: button.

This application is based on Japanese Patent Application serial no. 2012-125432 filed with Japan Patent Office on May 31, 2012, the entire contents of which are hereby incorporated by reference.

The invention claimed is:

1. A method for manufacturing a semiconductor device comprising the steps of:
    forming a gate electrode layer;
    forming a first gate insulating layer using a first mixed gas comprising a gas containing silicon and a gas comprising nitrogen;
    forming a second gate insulating layer using a second mixed gas comprising a gas containing silicon and a gas containing dinitrogen monoxide;
    forming a first oxide semiconductor layer over the second gate insulating layer;
    forming a second oxide semiconductor layer over the first oxide semiconductor layer;
    forming a source electrode layer over the second oxide semiconductor layer; and
    forming a drain electrode layer over the second oxide semiconductor layer,
    wherein the second oxide semiconductor layer is a crystalline oxide semiconductor layer,
    wherein the first oxide semiconductor layer comprises one or more of indium, gallium, and zinc, and
    wherein the second oxide semiconductor layer comprises one or more of indium, gallium, and zinc.

2. The method for manufacturing the semiconductor device according to claim 1, further comprising the step of supplying a third mixed gas comprising a gas containing silicon, a gas containing nitrogen, and a gas containing ammonia after supplying the first mixed gas to form the first gate insulating layer.

3. The method for manufacturing the semiconductor device according to claim 2, further comprising the step of supplying a fourth mixed gas comprising a gas containing silicon and a gas comprising nitrogen after supplying the third mixed gas to form the first gate insulating layer.

4. The method for manufacturing the semiconductor device according to claim 1, wherein each of the first gate insulating layer and the second gate insulating layer is formed by a plasma CVD.

5. The method for manufacturing the semiconductor device according to claim 1, wherein the first gate insulating layer includes a silicon nitride film.

6. The method for manufacturing the semiconductor device according to claim 1, wherein the first oxide semiconductor layer is a crystalline oxide semiconductor layer.

7. The method for manufacturing the semiconductor device according to claim 1, wherein an energy gap of the second oxide semiconductor layer is larger than an energy gap of the first oxide semiconductor layer.

8. The method for manufacturing the semiconductor device according to claim 1,
    wherein a content of the indium is higher than a content of the gallium in the first oxide semiconductor layer, and
    wherein a content of the indium is lower than or equal to a content of the gallium in the second oxide semiconductor layer.

9. The method for manufacturing the semiconductor device according to claim 1, wherein the second gate insulating layer comprises oxygen in excess of a stoichiometric composition.

10. A method for manufacturing a semiconductor device comprising the steps of:
    forming a gate electrode layer;
    forming a first gate insulating layer using a first mixed gas comprising a gas containing silicon and a gas comprising nitrogen;
    forming a second gate insulating layer using a second mixed gas comprising a gas containing silicon and a gas containing dinitrogen monoxide;
    forming a first oxide semiconductor layer over the second gate insulating layer;
    forming a second oxide semiconductor layer over the first oxide semiconductor layer;
    forming a third oxide semiconductor layer over the first oxide semiconductor layer;
    forming a source electrode layer over the second oxide semiconductor layer; and
    forming a drain electrode layer over the second oxide semiconductor layer,
    wherein the third oxide semiconductor layer is a crystalline oxide semiconductor layer,
    wherein the first oxide semiconductor layer comprises one or more of indium, gallium, and zinc,
    wherein the second oxide semiconductor layer comprises one or more of indium, gallium, and zinc, and
    wherein the third oxide semiconductor layer comprises one or more of indium, gallium, and zinc.

11. The method for manufacturing the semiconductor device according to claim 10, further comprising the step of supplying a third mixed gas comprising a gas containing silicon, a gas containing nitrogen, and a gas containing ammonia after supplying the first mixed gas to form the first gate insulating layer.

12. The method for manufacturing the semiconductor device according to claim 11, further comprising the step of supplying a fourth mixed gas comprising a gas containing silicon and a gas comprising nitrogen after supplying the third mixed gas to form the first gate insulating layer.

13. The method for manufacturing the semiconductor device according to claim 10, wherein each of the first gate insulating layer and the second gate insulating layer is formed by a plasma CVD.

14. The method for manufacturing the semiconductor device according to claim 10, wherein the first gate insulating layer includes a silicon nitride film.

15. The method for manufacturing the semiconductor device according to claim 10, wherein the first oxide semiconductor layer is a crystalline oxide semiconductor layer.

16. The method for manufacturing the semiconductor device according to claim 10, wherein the second oxide semiconductor layer is a crystalline oxide semiconductor layer.

17. The method for manufacturing the semiconductor device according to claim 10,
wherein the first oxide semiconductor layer is a crystalline oxide semiconductor layer, and
wherein the second oxide semiconductor layer is a crystalline oxide semiconductor layer.

18. The method for manufacturing the semiconductor device according to claim 10, wherein each of an energy gap of the first oxide semiconductor layer and an energy gap of the third oxide semiconductor layer is larger than an energy gap of the second oxide semiconductor layer.

19. The method for manufacturing the semiconductor device according to claim 10,
wherein a content of the indium is lower than or equal to a content of the gallium in the first oxide semiconductor layer,
wherein a content of the indium is higher than a content of the gallium in the second oxide semiconductor layer, and
wherein a content of the indium is lower than or equal to a content of the gallium in the third oxide semiconductor layer.

20. The method for manufacturing the semiconductor device according to claim 10, wherein the second gate insulating layer comprises oxygen in excess of a stoichiometric composition.

* * * * *